United States Patent
Pellerite et al.

(10) Patent No.: US 9,603,242 B2
(45) Date of Patent: Mar. 21, 2017

(54) LASER PATTERNING OF SILVER NANOWIRE-BASED TRANSPARENT ELECTRICALLY CONDUCTING COATINGS

(71) Applicant: 3M INNOVATIVE PROPERTIES COMPANY, St. Paul, MN (US)

(72) Inventors: Mark J. Pellerite, Woodbury, MN (US); John P. Baetzold, North St. Paul, MN (US); John J. Stradinger, Roseville, MN (US); Pingfan Wu, Woodbury, MN (US); Hyacinth L. Lechuga, St. Paul, MN (US); Manoj Nirmal, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 312 days.

(21) Appl. No.: 14/360,413

(22) PCT Filed: Dec. 10, 2012

(86) PCT No.: PCT/US2012/068731
§ 371 (c)(1),
(2) Date: May 23, 2014

(87) PCT Pub. No.: WO2013/095971
PCT Pub. Date: Jun. 27, 2013

(65) Prior Publication Data
US 2014/0332254 A1  Nov. 13, 2014

Related U.S. Application Data

(60) Provisional application No. 61/578,521, filed on Dec. 21, 2011.

(51) Int. Cl.
H01B 1/02 (2006.01)
H05K 1/02 (2006.01)
(Continued)

(52) U.S. Cl.
CPC ......... *H05K 1/0296* (2013.01); *B23K 26/362* (2013.01); *B23K 26/40* (2013.01);
(Continued)

(58) Field of Classification Search
CPC ........ H05K 1/0296; H05K 3/027; H01B 1/02; G02F 1/13439; G02F 2202/36; G02F 2202/022
See application file for complete search history.

(56) References Cited

U.S. PATENT DOCUMENTS

| 4,895,630 A | 1/1990 | Aufderheide |
| 5,641,426 A | 6/1997 | Nerad |

(Continued)

FOREIGN PATENT DOCUMENTS

| KR | 2010-0080123 | 7/2010 |
| WO | WO 93-14436 | 7/1993 |

(Continued)

OTHER PUBLICATIONS

International Search Report for PCT International Application No. PCT/US2012/068731, mailed on Mar. 12, 2013, 5pgs.

(Continued)

*Primary Examiner* — Laura Auer
(74) *Attorney, Agent, or Firm* — Stephen L. Crooks; Clifton F. Richardson

(57) ABSTRACT

A transparent electrical conductor (10; 20), comprising a transparent substrate (14; 201); a composite layer (18; 28) comprising an electrically conductive layer (12) disposed on at least a portion of a major surface of the transparent substrate (14; 201) and comprising a plurality of interconnecting metallic nanowires, and a polymeric overcoat layer (16) disposed on at least a portion of the electrically conductive layer (12); wherein a pattern in the composite layer includes an x-axis and a y-axis of an x-y plane of the (Continued)

composite layer and a z-axis into the x-y plane of the composite layer, and the pattern defines a plurality of electrically conductive regions (24, 24') in the x-y plane of the composite layer (18; 28), wherein the electrically conductive regions (24, 24') are separated from each other by electrically insulative traces (21), each of which defines a valley into the z-axis of the x-y plane of the composite layer (18; 28), the valley having a maximum depth (27) in a range from 50 nanometers to 100 nanometers relative to the x-y plane of the composite layer (18; 28), wherein the valley has a cross-sectional width (M1) in a range from 10 micrometers to 1000 micrometers, and wherein the valley further comprises a plurality of crevices (22) having a depth (23) in a range from 50 nanometers to 100 nanometers further into the z-axis of the x-y plane of the composite layer (18; 28). Methods for patternwise irradiating transparent electrodes (10; 20) to generate electrically insulating traces (21) are also described.

19 Claims, 18 Drawing Sheets

(51) Int. Cl.
| | | |
|---|---|---|
| *G02F 1/1343* | (2006.01) | |
| *B23K 26/36* | (2014.01) | |
| *B23K 26/40* | (2014.01) | |
| *B82Y 30/00* | (2011.01) | |
| *H05K 3/02* | (2006.01) | |
| *H05K 3/28* | (2006.01) | |

(52) U.S. Cl.
CPC .......... *G02F 1/13439* (2013.01); *H01B 1/02* (2013.01); *B23K 2201/34* (2013.01); *B23K 2201/38* (2013.01); *B23K 2203/172* (2015.10); *B82Y 30/00* (2013.01); *G02F 2202/022* (2013.01); *G02F 2202/36* (2013.01); *H05K 3/027* (2013.01); *H05K 3/282* (2013.01); *H05K 2201/0108* (2013.01); *H05K 2201/026* (2013.01); *Y10T 29/49204* (2015.01)

(56) References Cited

U.S. PATENT DOCUMENTS

| | | | |
|---|---|---|---|
| 5,867,238 | A | 2/1999 | Miller |
| 6,236,442 | B1 | 5/2001 | Stephenson et al. |
| 6,394,870 | B1 | 5/2002 | Petruchik et al. |
| 7,175,876 | B2 | 2/2007 | Free |
| 7,601,406 | B2 | 10/2009 | Garbar et al. |
| 2004/0195967 | A1 | 10/2004 | Padiyath |
| 2006/0270209 | A1 | 11/2006 | Mitsui et al. |
| 2007/0102682 | A1 | 5/2007 | Kodas |
| 2007/0137555 | A1 | 6/2007 | Yang |
| 2007/0231561 | A1 | 10/2007 | Pellerite |
| 2007/0241364 | A1 | 10/2007 | Akao et al. |
| 2008/0128397 | A1 | 6/2008 | Gandhi |
| 2008/0150165 | A1 | 6/2008 | Stumbo |
| 2008/0259262 | A1 | 10/2008 | Jones |
| 2009/0218310 | A1 | 9/2009 | Zu |
| 2009/0239042 | A1 | 9/2009 | Jain |
| 2010/0073936 | A1 | 3/2010 | Padiyath |
| 2010/0171948 | A1 | 7/2010 | Mazur |
| 2010/0243295 | A1* | 9/2010 | Allemand .............. B82Y 10/00 174/250 |
| 2010/0272933 | A1 | 10/2010 | McCormick |
| 2011/0088770 | A1 | 4/2011 | Allemand |

FOREIGN PATENT DOCUMENTS

| | | |
|---|---|---|
| WO | WO 2007-034994 | 3/2007 |
| WO | WO 2008-046058 | 4/2008 |
| WO | WO 2009-108306 | 9/2009 |
| WO | WO 2012-145157 | 10/2012 |

OTHER PUBLICATIONS

Hellmann, "Laser patterning of transparent electrode films: from solar panels through high-end displays", Industrial Laser Solutions for Manufacturing, Presented on Nov. 10, 2011, [retrieved from the Internet on Feb. 12, 2013], URL<:http://www.industrial-lasers.com/articles/2011/ll/laser-patterning-of-transparent-electrode-films-from-solar-panels-through-high-end-displays.html>, 6pgs.

Chenchiliyan, "Transparent Electrode Patterning using Laser Ablation for In-Plane Switching Liquid Crystal Display", AIP Conference Proceedings, 2011, vol. 1391, pp. 294-296.

De, "Silver Nanowire Networks as Flexible, Transparent, Conducting Films: Extremely High DC to Optical Conductivity Ratios", ACS Nano, 2009, vol. 3, No. 7, pp. 1767-1774.

DisplaySearch 2008 Flexible Electronics and Displays Report, Sep. 2008, pp. 262-263.

Nanomarkets, "The Future of ITO: Transparent Conductor and ITO Replacement Markets", 2008, 5pgs.

Spaid, "Wet Processable Transparent Conductive Materials", Information Display, 2012, vol. 28, No. 1, pp. 10-15.

Spechler, "Direct-write pulsed laser processed silver nanowire networks for transparent conducting electrodes", Applied Physics A: Materials Science & Processing, 2012, vol. 108, No. 1, pp. 25-28.

Weast, Handbook of Chemistry and Physics, F-140, (1970), 3 pages.

\* cited by examiner

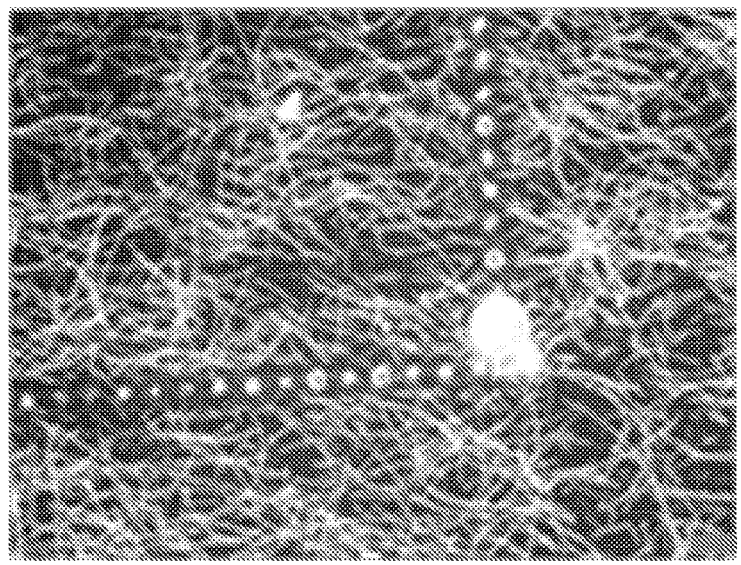
*Fig. 3C*  20 µm
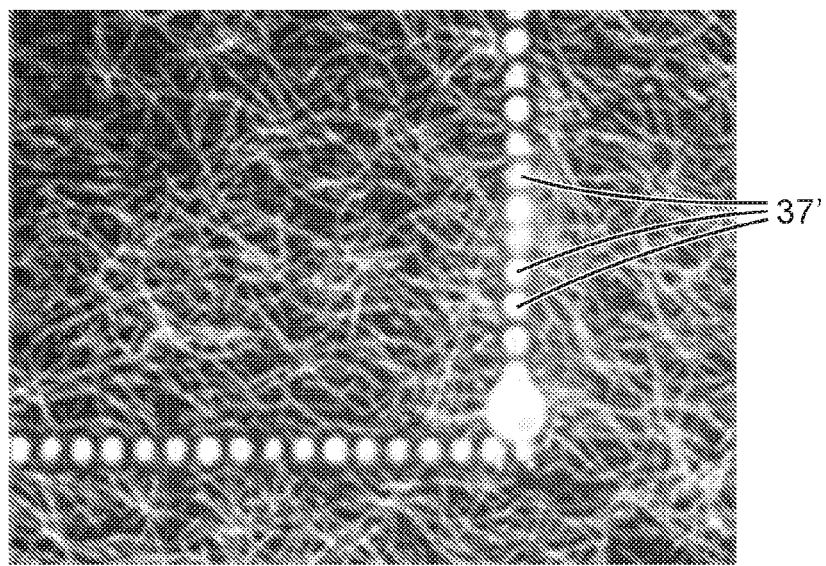
*Fig. 3D*  20 µm

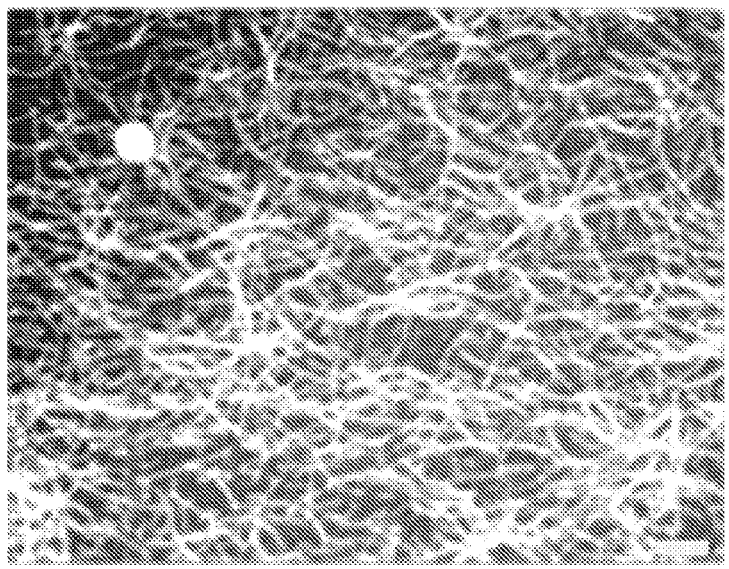
*Fig. 4A*  20 μm
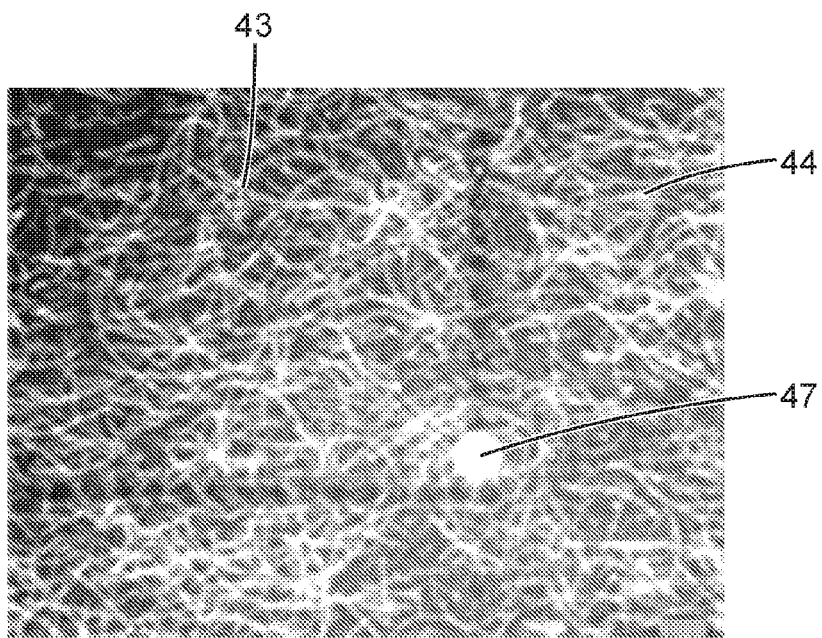
*Fig. 4B*  20 μm

LASER PATTERNING OF SILVER NANOWIRE-BASED TRANSPARENT ELECTRICALLY CONDUCTING COATINGS

BACKGROUND

Indium tin oxide (ITO) is widely used as the conductor in the transparent electrodes that are essential to the functioning of many different types of display devices. ITO has a number of drawbacks. These include brittleness, which can lead to handling difficulties on flexible substrates, and a high refractive index that can give rise to reflective losses in constructions utilizing ITO layers on polymer films. The latter is a particular problem for liquid crystal-based devices, in that reflective losses at the electrode/active layer interface can lead to decreases in transmission, in turn leading to lower contrast ratios and degradation of display performance. Furthermore, ITO films are generally deposited using vacuum processing, which can be problematical if expensive vacuum deposition equipment is not readily available. They also depend on the availability of indium metal, an expensive, limited, and potentially strategic resource. Thus, many flexible display devices could benefit from availability of alternative transparent conducting electrodes which are not based on ITO and can be prepared by roll-to-roll wet coating processing.

Silver has the highest bulk conductivity of any known material. Consequently, one class of coatings exhibiting great promise as a roll-coatable ITO replacement is silver nanowires. These materials can be coated from liquid dispersions using standard roll-to-roll coating methods such as slot die and gravure. Although such coatings can give excellent conductivity with high visible transmission and low haze, in some applications the oxidative and chemical instability of silver, particularly in nanowire form, can necessitate the use of a protective overcoat for the silver layer to protect it against mechanical, chemical, and environmental degradation and subsequent loss of conductivity properties.

SUMMARY

Many types of modern display and electronic devices utilizing transparent conductors require that the conductor be patternable in order to obtain conductive traces with well-defined geometries. For ITO, a number of methods are available for achieving this, most notably lithographic methods and laser ablation methods. Both have drawbacks. Lithographic methods are generally slow and involve multistep wet processing. Laser patterning may generate ablation debris that can redeposit on the edges of the laser traces, leading to elevated trace edge profiles that can cause problems with device shorting, particularly in thin flexible constructions involving an optically or electrically active thin layer between two opposing transparent conductor films. Improvements are needed in the laser patterning of transparent conductors.

In one aspect, the present disclosure describes a transparent electrode. The transparent electrical conductor comprises a transparent substrate; a composite layer comprising: an electrically conductive layer disposed on at least a portion of a major surface of the transparent substrate and comprising a plurality of interconnecting metallic nanowires; and a polymeric overcoat layer disposed on at least a portion of the electrically conductive layer; wherein a pattern in the composite layer includes an x-axis and a y-axis of an x-y plane of the composite layer and a z-axis into the x-y plane of the composite layer, and the pattern defines a plurality of electrically conductive regions in the x-y plane of the composite layer, wherein the electrically conductive regions are separated from each other by electrically insulative traces, each of which defines a valley into the z-axis of the x-y plane of the composite layer, the valley having a maximum depth in a range from 10 nanometers to 100 nanometers relative to the x-y plane of the composite layer, wherein the valley has a cross-sectional width in a range from 10 micrometers to 1000 micrometers, and wherein the valley further comprises a plurality of crevices having a depth in a range from 50 nanometers to 100 nanometers further into the z-axis of the x-y plane of the composite layer.

In some embodiments, the polymeric overcoat layer comprises nanoparticles selected from the group consisting of antimony tin oxide, zinc oxide, indium tin oxide, and combinations thereof. In some embodiments, a sheet resistance of the polymeric overcoat layer disposed on the transparent substrate without the conductive layer is greater than about $10^7$ ohm/sq.

In another aspect, the present disclosure describes a method comprising providing a transparent electrically conductive film comprising: a transparent substrate; a composite layer comprising: an electrically conductive layer disposed on at least a portion of a major surface of the transparent substrate and comprising a plurality of interconnecting metallic nanowires; and a polymeric overcoat layer disposed on at least a portion of the electrically conductive layer; and patternwise irradiating the transparent electrically conductive film according to a pattern to provide a patternwise irradiated transparent electrically conductive film comprising a pattern in the composite layer; wherein a pattern in the composite layer includes an x-axis and a y-axis of an x-y plane of the composite layer and a z-axis into the x-y plane of the composite layer, and the pattern defines a plurality of electrically conductive regions in the x-y plane of the composite layer, wherein the electrically conductive regions are separated from each other by electrically insulative traces, each of which defines a valley into the z-axis of the x-y plane of the composite layer, the valley having a maximum depth in a range from 10 nanometers to 100 nanometers relative to the x-y plane of the composite layer, wherein the valley has a cross-sectional width in a range from 10 micrometers to 1000 micrometers, and wherein the valley further comprises a plurality of crevices having a depth in a range from 50 nanometers to 100 nanometers further into the z-axis of the x-y plane of the composite layer.

Nanostructured films according to embodiments of the present description typically comprise interconnected network(s) of silver nanowires. Such network(s) are preferably substantially electrically conductive. Such films may additionally be optically transparent.

A film is said to be "transparent" when the layer or layers permit at least 80% of at least a portion of incident electromagnetic radiation from about 400 nm to about 700 nm to pass through the layer or layers.

A film is said to be "optically transparent" when it is substantially optically clear such that when viewing an object on an opposing side of the electrode, little or no distortion of the object is visually observed by an unaided eye with 20:20 vision.

"Electrically conductive region" refers to a region of a film having a sheet resistance of less than $10^4$ ohm per square.

"Electrically insulative trace" refers to a trace between electrically conductive regions that provides a resistance of at least $10^6$ ohm between the electrically conductive regions, as measured with a two point probe.

These and other aspects of the invention are described in the detailed description below. In no event should the above summary be construed as a limitation on the claimed subject matter which is defined solely by the claims as set forth herein.

BRIEF DESCRIPTION OF DRAWINGS

FIGS. 3A to 3D are micrographic visible light images of transparent electrodes described herein, showing laser traces;

FIGS. 4A to 4D are micrographic visible light images of transparent electrodes described herein, showing laser traces;

DETAILED DESCRIPTION

Figure 1:
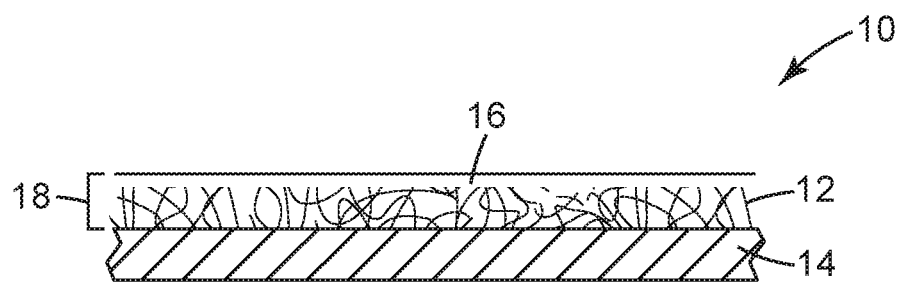
FIG. 1 shows a cross-sectional view of a conductive portion of an exemplary embodiment of transparent electrode described herein.

FIG. 1 shows a cross-sectional view of an exemplary embodiment of a transparent electrode (i.e., transparent electrical conductor) 10 of the present disclosure, showing one of a plurality of electrically conductive regions thereof. Transparent electrode 10 comprises an electrically conductive layer 12 of interconnecting metallic nanowires disposed on at least a portion of a major surface of transparent substrate 14, and polymeric overcoat layer 16 is disposed on electrically conductive layer 12. Polymeric overcoat layer 16 and electrically conductive layer 12 together form composite layer 18 (i.e., a polymeric nanowire layer). Not shown in FIG. 1 is an electrically insulative trace that separates the plurality of electrically conductive regions.

Figure 2:
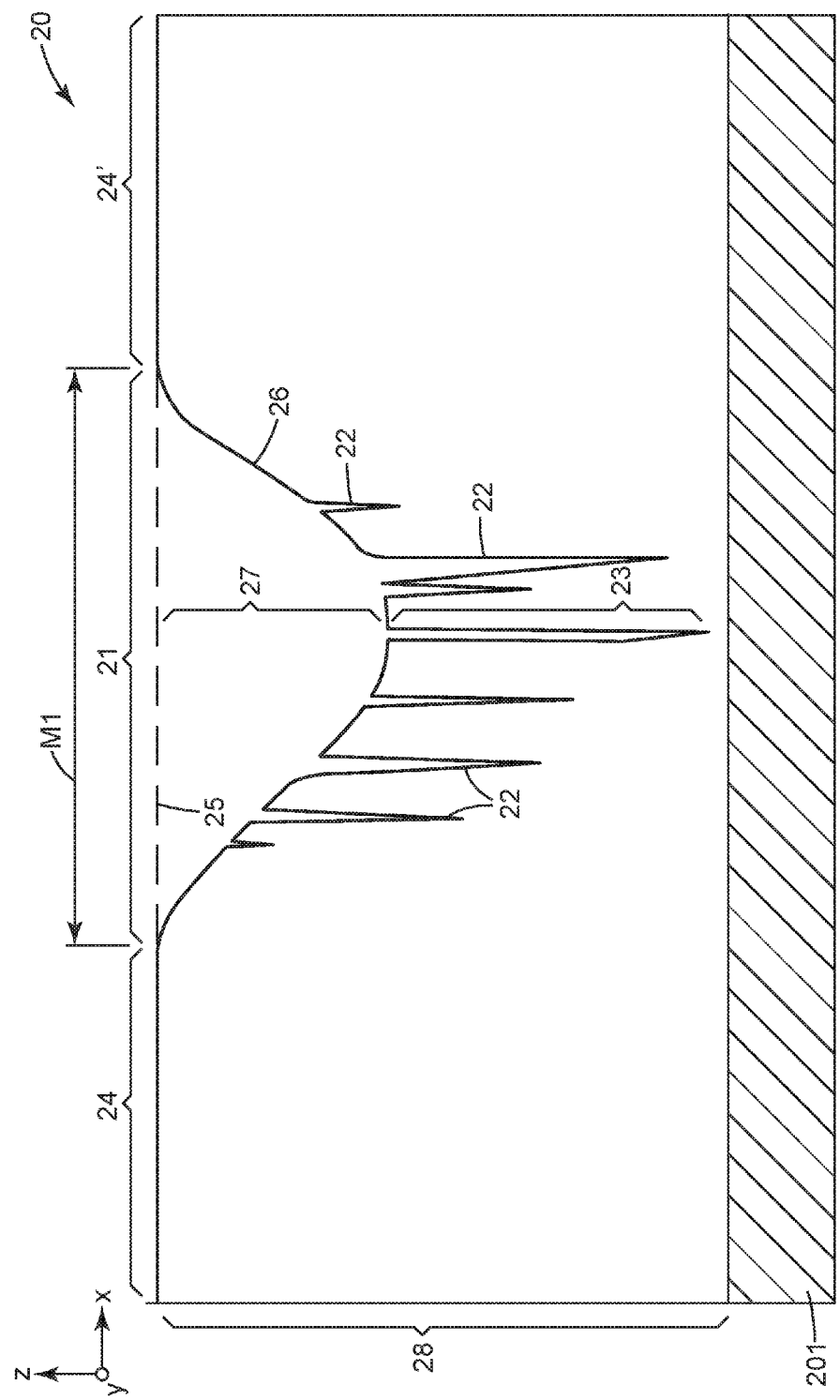
FIG. 2 is a profile idealized view of an insulative trace in a patterned transparent electrode described herein.
Figure 3A:
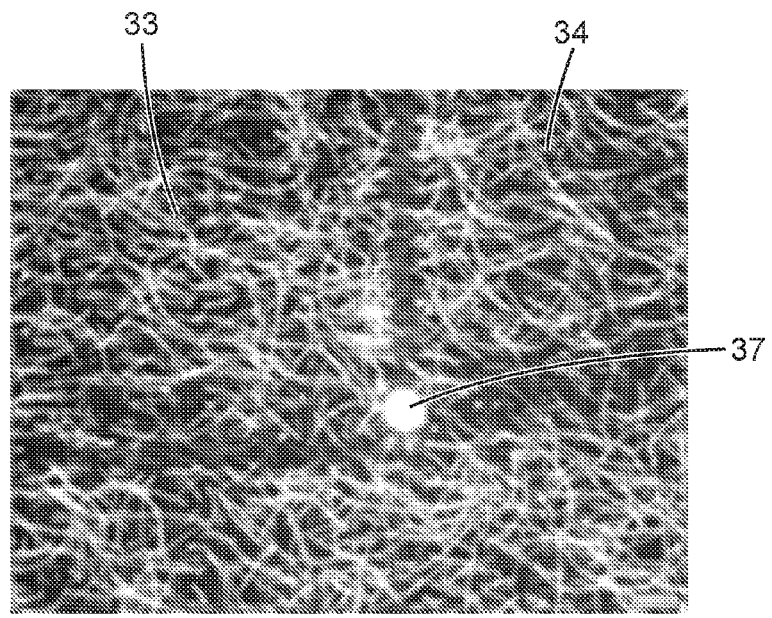
Figure 3B:
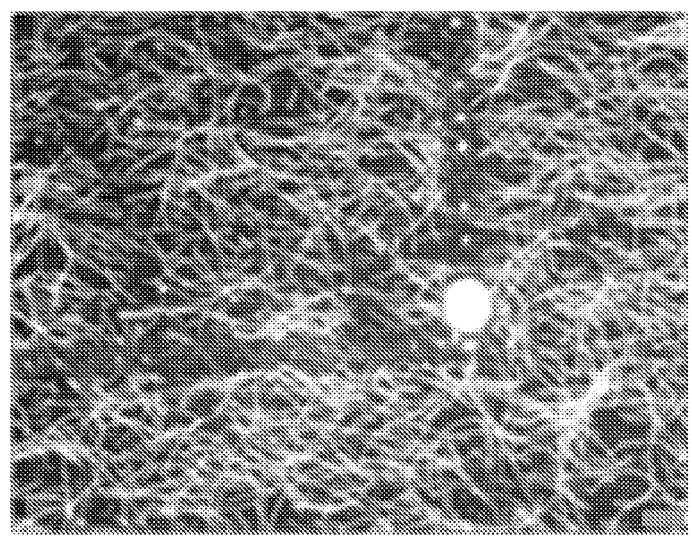
Figure 4C:
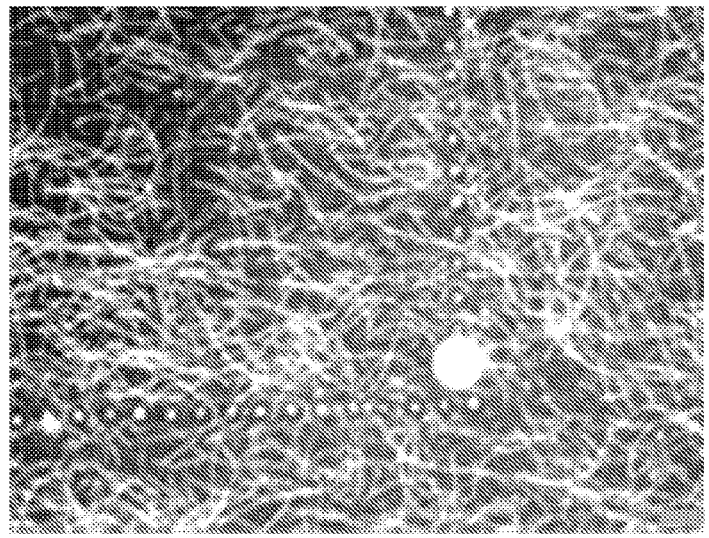
Figure 4D:
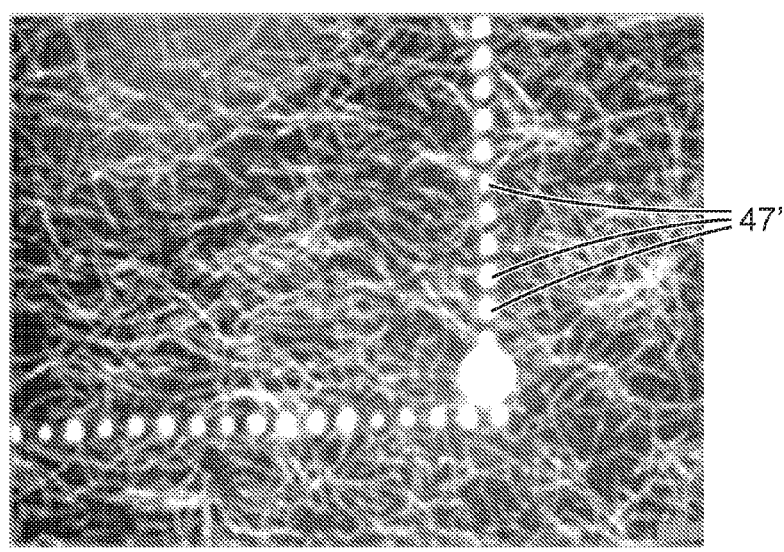

FIG. 2 is an idealized profile view of a patterned transparent electrical conductor (i.e., transparent electrode) 20 of the present description, illustrating aspects of an electrically insulative trace 21 in order to describe aspects of the atomic force microscopy ("AFM"; AFM is described in more detail in the Examples section) profile data shown in, for example, FIGS. 5B, 5C, 6B, 7B, 8B, 10B, and 12B. The idealized profile view of transparent electrical conductor 20 is oriented with respect to an x-axis and a y-axis of an x-y plane 25 of composite layer 28 (interconnecting metallic nanowires of composite layer 28 are not shown), and a z-axis into the x-y plane of composite layer 28. Electrically insulative trace 21 defines a valley 26 separating electrically conductive regions 24 and 24', and valley 26 has a maximum depth 27 and a cross-sectional width M1. Electrically insulative trace 21 further comprises a plurality of crevices 22 having a depth 23 further into the z-axis of the x-y plane of composite layer 28. While the embodiment shown in FIG. 2 shows valley 26 and plurality of crevices 22 extending along the z-axis only within composite layer 28, in some embodiments (not shown) plurality of crevices 22 may extend along the z-axis into transparent substrate 201. In some embodiments (not shown), maximum depth 27 of valley 26 may extend along the z-axis into transparent substrate 201.

Electrically insulative laser traces of the present disclosure typically have two levels of structure in the cross-sectional analyses of these insulative laser traces: a broad, primary valley (i.e., trench) having a width corresponding approximately to the width of the laser beam, with depths that can range from less than 10 nm to greater than 100 nm depending on the coating and laser power, has superimposed on it relatively sharp crevices in the shapes of the silver nanowires with depths up to 50-100 nm.

Embodiments of electrically insulative laser traces of the present disclosure may have features deviating from ideal. For example, in some embodiments, the laser trace may be a series of spots where a pulsed laser traversed the transparent electrode. AFM images of pulsed laser traces may be seen in the Example section (see, for example, FIGS. 5A, 6A, 7A, 8A, 10A, and 12A), with varying degrees of deviation from an ideal being observed.

In some embodiments, transparent electrode 20 of the present disclosure is optically transparent. Transparent electrode 20 may be flexible such that it can be flexed without loss of electrically conductive properties, to provide a display that is conformable to a curved surface.

The electrically conductive regions of transparent electrodes of the present disclosure comprise a transparent substrate bearing a strip, plane or surface that is electrically conductive (sheet resistivity of less than about $10^4$ ohm/sq) and transmits radiation of at least some portion of the electromagnetic spectrum. In particular, the transparent electrode comprises: a transparent substrate, a conductive layer disposed on the transparent substrate and comprising metallic nanowires, a polymeric overcoat layer disposed on the conductive layer and optionally comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

The transparent electrode can be used in display applications in which optical performance requires low haze and high visible light transmission. For example, such a display comprises: (a) a first electrode comprising the transparent electrode, wherein the transparent substrate comprises a first substrate; (b) a second substrate; and (c) image forming material disposed between the polymeric overcoat layer and the second substrate. In some embodiments, the second substrate is transparent. In some embodiments, the second substrate is opaque. Exemplary displays in which the transparent electrode may be used include polymer-dispersed liquid crystal displays, liquid crystal displays, electrophoretic displays, electrochromic displays, electroluminescent displays and plasma displays.

Transparent electrodes made with silver as the conductive material are known. Silver can be utilized as a transparent conductive material when used in the form of silver nanowires, meshes or lines, as described in WO 2008/046058 (Allemand et al.). Although silver coatings provide excellent conductivity with high visible light transmission and low haze, in some applications the oxidative and chemical instability of silver, particularly in nanowire form, can necessitate the use of a protective overcoat for the silver layer. The protective overcoat can protect the silver from mechanical damage and environmental degradation which can lead to loss of conductivity of the silver.

Protective overcoats for silver include those having insulating electrical properties. A protective overcoat is considered to have insulating electrical properties if a coating of the protective overcoat on the substrate, without the silver nanowires, has a sheet resistance greater than about $10^{12}$ ohm/sq. Materials such as UV-curable acrylic resins have insulating properties and are particularly useful for making protective overcoats.

Protective overcoats for silver include those having conducting properties. A protective overcoat is considered to have conducting properties if a coating of the protective overcoat on the substrate, without the silver nanowires, has a sheet resistance less than about $10^4$ ohm/sq. Materials useful for making a protective overcoat having conducting properties include various types of vacuum-applied coatings comprising ITO, but this approach is not advantageous for reasons described above for ITO itself. Conducting protective overcoats can also include conducting polymers but these materials absorb strongly in the visible region. For example, poly(3,4-ethylenedioxythiophene) poly(styrene sulfonate) (often referred to as PEDOT/PSS) is widely used yet it is deep blue. Conducting polymers such as PEDOT/PSS, other polythiophenes, and polyanilines can also be used as overcoats applied so as to give overcoat sheet resistance up to $10^9$ ohm/sq. Such overcoats are particularly useful in OLED device constructions.

In some embodiments, the transparent electrode exhibits little or no haze, meaning it may have a haze value not greater than about 10% (in some embodiments, not greater than about 5%, or even not greater than about 2%). For light normally incident on the transparent electrode, the haze value is the ratio of transmitted light intensity that deviates from the normal direction by more than 4 degrees to the total transmitted light intensity. Haze values disclosed herein were measured using a haze meter (available from BYK-Gardiner, Silver Springs, Md., under the trade designation "HAZE-GARD PLUS") according to the procedure described in ASTM D1003.

In some embodiments, the transparent electrode has high light transmittance of from about 80% to about 100% (in some embodiments, from about 90% to about 100%, from about 95% to about 100%, or even from about 98% to about 100%) over at least a portion of the visible light spectrum (about 400 to about 700 nm). In some embodiments, the transparent electrode has a high light transmittance of at least about 80%, from about 90% to about 100%, or from about 90% to about 95% over at least a portion of the visible light spectrum (about 400 to about 700 nm), and a haze value from about 0.01% to less than about 5%.

The conductive layer comprises metallic nanowires which have an aspect ratio greater than about 10, the aspect ratio being determined by dividing the length of the particles by their diameter. As used herein, metallic nanowire refers to a metallic wire comprising metal, metal alloys or metal compounds including metal oxides. At least one cross-sectional dimension of the metallic nanowire is less than 500 nm (in some embodiments, less than 200 nm or even less than 100 nm). The aspect ratio is greater than about 10, greater than about 50, greater than about 100 or from about 10 to about 100,000. Metallic nanowires can comprise any metal including silver, gold, copper, nickel and gold-plated silver. In one embodiment, the metallic nanowires comprise silver nanowires as described, for example, in WO 2008/046058 (Allemand et al.). Silver nanowires can be prepared as described in WO 2008/046058 or obtained from commercial sources (e.g., Blue Nano, Charlotte, N.C.; Seashell, La Jolla, Calif.; and Nanogap USA, San Francisco, Calif.).

The metallic nanowires form a conductive network on the surface of the transparent substrate. In general, a dispersion of the metallic nanowires in some solvent is prepared and coated on the transparent substrate, followed by drying the coating to remove the solvent. Any solvent that forms a stable dispersion with the metallic nanowires can be used, for example, water, alcohols, ketones, ethers, hydrocarbons, aromatic hydrocarbons, and compatible mixtures thereof. The dispersion comprising the metallic nanowires can comprise additives typically used in coating formulations (e.g., surfactants, binders, materials for controlling viscosity, and corrosion inhibitors). Optimization of dispersion formulations and coating and drying conditions is described in WO 2008/046058 (Allemand et al.).

In general, the thickness of the conductive layer depends upon the particular metallic nanowires being used, properties of the polymeric overcoat layer, and the imaging material. In most cases, it is desirable to minimize the amount of metallic nanowires used in order to minimize cost and any adverse effects on the performance of the display. The conductive layer may comprise a variety of components in addition to the metallic nanowires. In one embodiment, the conductive layer consists essentially of the metallic nanowires. In another embodiment, the conductive layer comprises greater than about 40 wt % of the metallic nanowires, with the remaining wt % comprising additives such as binders and surfactants.

The thickness of the conductive layer is typically less than about 500 nm. In some embodiments, the conductive layer is in the form of a mesh or network of nanowires or in some discontinuous form across a surface of the transparent substrate. In some embodiments, the metallic nanowires are disposed on the transparent substrate such that they form a pattern comprising transparent conductive regions and transparent non-conductive regions. An exemplary pattern comprises an array of lines or discrete conductive regions spaced apart from each other by about 5 micrometers to about 500 micrometers or more.

Typically, the particular metallic nanowires used and the thickness of the conductive layer is determined by the desired sheet resistance of the layer disposed on the transparent substrate. The typical range of sheet resistance is from about 10 ohm/sq to about 5000 ohm/sq, with preferred ranges depending on the particular device and application. For organic light-emitting diode (OLED) devices, a typical sheet resistance is from about 10 to about 50 ohm/sq; for PDLC and cholesteric liquid crystal devices, typical sheet resistance is from about 50 to about 250 ohm/sq; and for electrophoretic display devices, typical sheet resistance is from about 50 to about 2000 ohm/sq.

Sheet resistance of the conductive layer can be measured by contact and non-contact methods. For the contact method, a two-point probe comprising two metal contacts connected to a voltmeter is placed on the conductive layer such that the probe is in contact with layer. For the non-contact method, an instrument having a contactless probe may be used (e.g., the instrument available from Delcom Products Inc., Prescott, Wis., under the trade designation "DELCOM 717B NON-CONTACT CONDUCTANCE MONITOR").

The transparent electrode can be used in different types of displays as described below. In some displays, the transparent electrode needs to be designed such that light is transmitted through the electrode and toward the viewer. In these cases, the components and thickness of the conductive layer need to be selected such that optical properties of the layer meet certain requirements.

The polymeric overcoat layer is disposed on the conductive layer such that the metallic nanowires are protected from adverse environmental factors such as corrosion and abrasion. In particular, the polymeric overcoat layer may be designed to prevent or at least minimize the permeability of corrosive elements, such as moisture, trace amounts of acid, oxygen, and sulfur.

In general, the polymeric overcoat layer is formed from organic components which may or may not be pre-polymerized. The organic components are not particularly limited as long as the polymeric overcoat layer can be formed on the conductive layer, and the conductive layer is protected from corrosion and abrasion yet can function as desired in the resulting display.

In some embodiments, the polymeric overcoat layer is formed from a polymerizable formulation comprising one or more polymerizable components such as monomers which can include small molecules having a molecular weight less than about 500 g/mole, oligomers having a molecular weight of greater than 500 g/mole to about 10,000 g/mole, and polymers having a molecular weight of greater than 10,000 g/mole to about 100,000 g/mole. The polymerizable monomers or oligomers can be cured using actinic radiation (e.g., visible light, ultraviolet radiation, electron beam radiation, heat and combinations thereof), or any of a variety of conventional anionic, cationic, free radical, or other polymerization techniques, which can be photochemically, thermally, or redox initiated.

Representative examples of polymerizable groups suitable for forming the polymeric overcoat layer include epoxy groups, ethylenically unsaturated groups, allyloxy groups, (meth)acrylate groups, (meth)acrylamide groups, cyanoester groups, vinyl ether groups, and combinations thereof. The monomers may be mono- or multifunctional and capable of forming a crosslinked network upon polymerization. As used herein, (meth)acrylate refers to acrylate and methacrylate, and (meth)acrylamide refers to acrylamide and methacrylamide.

Useful monofunctional monomers include styrene, alpha-methylstyrene, substituted styrenes, vinyl esters, vinyl ethers, N-vinyl-2- pyrrolidone, (meth)acrylamide, N-substituted (meth)acrylamides, octyl(meth)acrylate, iso-octyl (meth)acrylate, nonylphenol ethoxylate(meth)acrylate, isononyl(meth)acrylate, diethylene glycol mono(meth)acrylate, isobornyl(meth)acrylate, 2-(2-ethoxyethoxy)ethyl (meth)acrylate, 2-ethylhexyl(meth)acrylate, lauryl(meth) acrylate, butanediol mono(meth)acrylate, beta-carboxyethyl (meth)acrylate, isobutyl(meth)acrylate, cycloaliphatic epoxides, 2- hydroxyethyl(meth)acrylate, (meth)acrylonitrile, maleic anhydride, itaconic acid, isodecyl(meth)acrylate, dodecyl(meth)acrylate, n-butyl(meth)acrylate, methyl (meth)acrylate, hexyl(meth)acrylate, (meth)acrylic acid, N-vinylcaprolactam, stearyl(meth)acrylate, hydroxyl functional polycaprolactone ester(meth)acrylate, hydroxypropyl (meth)acrylate, hydroxyisopropyl(meth)acrylate, hydroxybutyl(meth)acrylate, hydroxyisobutyl(meth)acrylate, tetrahydrofurfuryl(meth)acrylate, and combinations thereof.

Suitable high molecular weight constituents comprising polymerizable oligomers and polymers may be incorporated into the polymeric overcoat layer for providing durability, flexibility, adhesion to the conductive layer and/or transparent substrate, weatherability, and permeability. These high molecular weight constituents may also be useful for obtaining a suitable coating formulation for forming the polymeric overcoat layer, for example, they may be used to provide viscosity control or reduce shrinkage of the layer upon curing. The oligomers and/or polymers themselves may be straight-chained, branched, and/or cyclic. Branched oligomers and/or polymers tend to have lower viscosity than straight-chain counterparts of comparable molecular weight.

Exemplary polymerizable oligomers and polymers include aliphatic polyurethanes, (meth)acrylates, polyesters, polyimides, polyamides, epoxy polymers, polystyrene (including copolymers of styrene) and substituted styrenes, silicone-containing polymers, fluorinated polymers, and combinations thereof. For some applications, polyurethane (meth)acrylate oligomers and/or polymers can have improved durability and weatherability characteristics. Such materials also tend to be readily soluble in reactive diluents formed from radiation curable monomers, particularly (meth)acrylate monomers. Exemplary polymerizable oligomers and polymers include combinations of the above-described functionalities such as urethane(meth)acrylates, epoxy(meth)acrylates, polyester(meth)acrylates, polyether (meth)acrylates, (meth)acrylated(meth)acrylics, (meth)acrylated silicones, vinyl(meth)acrylates, and (meth)acrylated oils.

The polymeric overcoat layer can also be formed from organic components which are not polymerizable, particularly polymers which are simply combined with other overcoat components in some aqueous and/or organic solvent-based formulation and coated over the conductive layer, followed by removal of any volatiles to form the polymeric overcoat layer. Exemplary polymers include poly(meth) acrylates, polystyrenes, polyurethanes, polythiophenes, polyanilines, polypyrroles, poly(vinylalcohol) copolymers and polyesters.

Particular examples of monofunctional monomers include those described above. Particular examples of multifunctional monomers include pentaerythritol triacrylate (available from Sartomer Co., Exton, Pa., under the trade designation "SR 444C"), hexanediol diacrylate, urethane acrylate oligomers (including, e.g., those oligomers available from Sartomer Co., under the trade designation "CN 981 B88", and from Cytec Industries, Wallingford, Conn., under the trade designations "UCECOAT 7655" AND "UCECOAT 7689").

Particular examples of preformed polymers include polymethylmethacrylates (including those polymethylmethacrylates available from Lucite International, Inc. under the trade designation "ELVACITE 2041"), polystyrenes, polythiophenes (including those polythiophenes available from Plextronics, Inc., Pittsburgh, Pa., under the trade designations "PLEXCORE OC RG-1100" and "PLEXCORE OC RG-1200"), and polyvinylbutyrals (including those polyvinylbutyrals available from Solutia Inc., St. Louis, Mo., under the trade designation "BUTVAR").

In some embodiments, the polymeric overcoat layer comprises the reaction product of a multifunctional (meth)acrylate. For example, the polymeric overcoat layer may comprise a methyl(meth)acrylate polymer and the reaction product of a multifunctional (meth)acrylate. For another example, the polymeric overcoat layer may comprise the reaction product of a multifunctional (meth)acrylate and a urethane(meth)acrylate oligomer.

The polymeric overcoat layer may also comprise nanoparticles having a diameter of less than about 500 nm (in some embodiments, from about 10 nm to about 500 nm, or even from about 40 nm to about 200 nm), and selected from the group consisting of antimony tin oxide, zinc oxide, indium tin oxide, and combinations thereof. These metal oxide nanoparticles can be prepared by hydrothermal synthetic methods or obtained from commercial sources (e.g., Advanced Nano Products, Korea; Sukgyung AT Inc., Des Plaines, Ill.; and Evonik Degussa Corp., Parsippany, N.J.).

The polymeric overcoat layer comprises the organic components and nanoparticles in any relative amount as long as the desired properties and performance of the layer are obtained. In some embodiments, the weight ratio of organic components to nanoparticles may be from about 85:15 to about 25:75, and even in some embodiments from about 75:25 to about 40:60.

The thickness of the polymeric overcoat layer is not particularly limited as long as the layer protects the metallic nanowires from corrosion and abrasion, and the desired properties and performance of the layer are obtained. In some embodiments, the thickness of the polymeric overcoat layer is less than about 1 micrometer, and even in some embodiments from about 50 nm to about 1 micrometer. In some exemplary embodiments, the polymeric overcoat layer may be disposed on the conductive layer such that portions of the metallic nanowires protrude from the surface of the polymeric overcoat layer to enable access to the conductive layer. In some embodiments, the metallic nanowires do not protrude from the surface of the polymeric overcoat layer, and the conductive layer is accessed through an opening in the polymeric overcoat or an opening at an edge of the transparent electrode. In some embodiments, the metallic nanowires do not protrude from the surface of the polymeric layer, and the conductive layer is accessed through thin portions of the polymeric overcoat layer.

In general, the particular components and amounts, layer thickness, etc. of the polymeric overcoat layer will depend upon any number of factors, for example, the chemistry of the organic components, the nanoparticles, the metallic nanowires being used, the amount of metallic nanowires present in the conductive layer, the thickness of the conductive layer, the imaging material and the type of display in which the transparent electrode is used.

In some embodiments, the polymeric overcoat layer comprises an optically clear layer having high light transmittance of from about 80% to about 100% (in some embodiments, from about 90% to about 100%, from about 95% to about 100%, or even from about 98% to about 100%), over at least a portion of the visible light spectrum (about 400 nm to about 700 nm). In some embodiments, the polymeric overcoat layer has a haze value of less than about 5% (in some embodiments, less than about 3%, or even less than about 1%). In some embodiments, the polymeric overcoat layer has a haze value of from about 0.1 to less than about 5% (in some embodiments, from about 0.1 to less than about 3%, or even from about 0.1 to less than about 1%).

The polymeric overcoat layer is selected depending on the desired properties of the layer, the transparent electrode and the display into which it is incorporated. The coating formulation for the polymeric overcoat layer is coated directly on the transparent substrate without the conductive layer, and curing, drying etc. are carried out to form the polymeric overcoat layer. Performance of the polymeric overcoat layer is then determined by measuring the sheet resistance of the coated transparent substrate. A sheet resistance of the polymeric overcoat layer disposed on the transparent substrate without the conductive layer should be greater than about $10^7$ ohm/sq. In some embodiments, the sheet resistance is from about $10^7$ ohm/sq to about $10^{12}$ ohm/sq. For a given polymeric overcoat layer, the sheet resistance can be varied by changing the thickness of the layer, and the layer can be as thin as desired, as long as the metallic nanowires are protected from corrosion and abrasion. Sheet resistance of the polymeric overcoat layer can be measured by contact and non-contact methods as described above.

In some embodiments, the transparent substrate is substantially optically clear such that when viewing an object on an opposing side of the substrate, little or no distortion of the object is observed, or some acceptable level of distortion is observed. In some embodiments, the transparent substrate exhibits little or no haze, meaning it may have a haze value not greater than about 10%, not greater than about 5% or not greater than about 2%. In some embodiments, the transparent substrate has high light transmittance of from about 80% to about 100% (in some embodiments, from about 90% to about 100%, from about 95% to about 100%, or even from about 98% to about 100%) over at least a portion of the visible light spectrum (about 400 nm to about 700 nm). In some embodiments, the transparent substrate has a high light transmittance of at least about 80% (in some embodiments, from about 90% to about 100%, or even from about 90% to about 95%) over at least a portion of the visible light spectrum (about 400 nm to about 700 nm), and a haze value from about 0.1% to less than about 5%. The transparent substrate can be reflective, antireflective, polarizing, non-polarizing, colored (transmissive to particular wavelengths of light) or combinations thereof.

The transparent substrate can comprise any useful material such as, for example, polymer, glass, crystalline ceramic, glass-ceramic, metal, metal oxide, or combinations thereof. Examples of polymers that may be used as the transparent substrate include thermoplastic polymers (e.g., polyolefins, poly(meth)acrylates, polyamides, polyimides, polycarbonates, polyesters, and biphenyl- or naphthalene-based liquid crystal polymers). Further examples of useful thermoplastics include polyethylene, polypropylene, polystyrene, poly(methylmethacrylate), bisphenol A polycarbonate, poly(vinyl chloride), polyethylene terephthalate, polyethylene naphthalate, polyethersulfone, cellulose acetates and poly(vinylidene fluoride). Some of these polymers also have optical properties (e.g., transparency) that make them especially well-suited for certain display applications wherein they would support a patterned conductor (e.g., polycarbonates, polyimides, polyesters, and combinations thereof).

The transparent substrate may have any useful thickness, ranging from about 5 micrometers to about 1000 micrometers (in some embodiments, from about 25 micrometers to about 500 micrometers, from about 50 micrometers to about 250 micrometers, or even from about 75 micrometers to about 200 micrometers). In embodiments where the transparent substrate is glass, the thickness can be up to 250 micrometers or greater.

The transparent substrate can be flexible such that it can be flexed or wound around a cylindrical mandrel of specified diameter without cracking or breaking. The transparent substrate may be rigid. In some embodiments, the transparent substrate has sufficient mechanical properties such as strength and flexibility to be processed on a roll-to-roll apparatus wherein a material is wound onto or unwound from a support, as well as further processed in some way. Examples of further processing include coating, slitting, laminating, and exposing to radiation.

The transparent substrate can include multiple layers of material such as a support layer, a primer layer, a hard coat layer, or a decorative design. The transparent substrate can be permanently or temporarily attached to an adhesive layer. For example, the transparent substrate can have an adhesive layer on a major surface thereof, and a release liner can be disposed on the adhesive layer and removed for attachment of the adhesive layer to another substrate.

The polymeric nanowire layer (e.g., layer 18 described above) can be disposed on a multilayer substrate designed to function as a barrier film in displays such as electrophoretic and organic light-emitting diode (OLED) devices. In general, barrier films have specific oxygen and water transmission rates at a specified level as required by the application in which the film is used. For example, the polymeric nanowire layer can be used in a flexible multilayer construction comprising alternating organic and inorganic layers disposed on a substrate. Flexible multilayer constructions of this type are described in US2010/0073936 A1 and US2010/0195967 A1 (both to Padiyath et al.) and US 2010/0272933 A1 (McCormick et al.); the disclosures of each of which are incorporated herein by reference.

In an embodiment of a patterning method of the present disclosure, a transparent electrically conductive film (i.e., a nanostructured film) is provided, and patternwise irradiated according to a pattern to provide a patternwise irradiated transparent electrically conductive film. In some embodiments, the patterning method comprises patternwise irradiating a transparent electrically conductive film using a laser. In some embodiments, the laser used is a solid state ultraviolet ("UV") laser (e.g., a frequency tripled Nd:YVO4 laser). UV lasers typically include laser wavelengths of up to 450 nm. UV lasers can be effective in patterning nanostructured films in single passes and at a resolution from below 5 micrometers up to 200 micrometers, even at a power level as low as 0.1 Watt. Other types of lasers may be employed (e.g., gas lasers, chemical lasers, excimer lasers, other solid state lasers, fiber-hosted lasers, semiconductor lasers, dye lasers and/or free electron lasers), alone or in combination, at suitable power levels.

The transparent electrically conductive film may be mounted on a roll-to-roll apparatus for a continuous patternwise irradiating process. As compared to a batch process, which handles only one component at a time, a roll-to-roll process can substantially reduce capital equipment and part costs, while significantly increasing throughput. In some embodiments, the transparent electrically conductive film is subject to patternwise irradiating while moving at a rate of at least about 1-2 meters per minute to increase throughput.

Patternwise irradiating can be further controlled by varying laser pulse duration (e.g., from milliseconds to femtoseconds) and/or fluxes. For example, at a low laser flux the nanostructured film absorbs laser energy and melts/evaporates/sublimates, while at high laser flux the nanostructured film is typically converted to plasma and is ablated.

In some embodiments, short (picosecond, femtosecond, or even nanosecond) pulses are used to patternwise irradiate the nanostructured film material. Due to their high peak intensities, such pulses can effectively patternwise irradiate nanostructured films through the rapid creation of plasma, which absorbs incident laser energy resulting in direct vaporization from the target surface, with often negligible collateral heating and shock-wave damage to the substrate or neighboring structure (which can be key in preserving the properties of the remaining patterned nanostructured film).

While patternwise irradiating is preferably performed with a pulsed laser, nanostructured films may also be patternwise irradiated with continuous wave and/or long pulse lasers (e.g., at high intensity). Continuous wave and long pulse (millisecond to nanosecond) laser ablation are primarily used to heat a target material through the liquid phase to the vapor phase. This technique can be used to pattern nanostructured films, according to an additional embodiment of the present description, where, for example, a nanostructure solution is deposited on a substrate and laser ablation is used to selectively remove this thin film deposition, and thereby produce a patterned nanostructured film.

In one exemplary embodiment, the substrate film was patterned using a solid state UV laser, said substrate moving on a roll-to-roll apparatus from a roll of uncoated substrate to a roll of coated substrate at a rate of 2 meters per minute. The laser provided a resolution of less than 5-200 micrometers in the films in single passes, even at power levels as low as 0.1 Watt. The film patterned in this run was of a quality suitable for optoelectronic applications (e.g., with a sheet resistance of less than about 500 ohms/square and an optical transmission of at least 80%).

Figure 13:
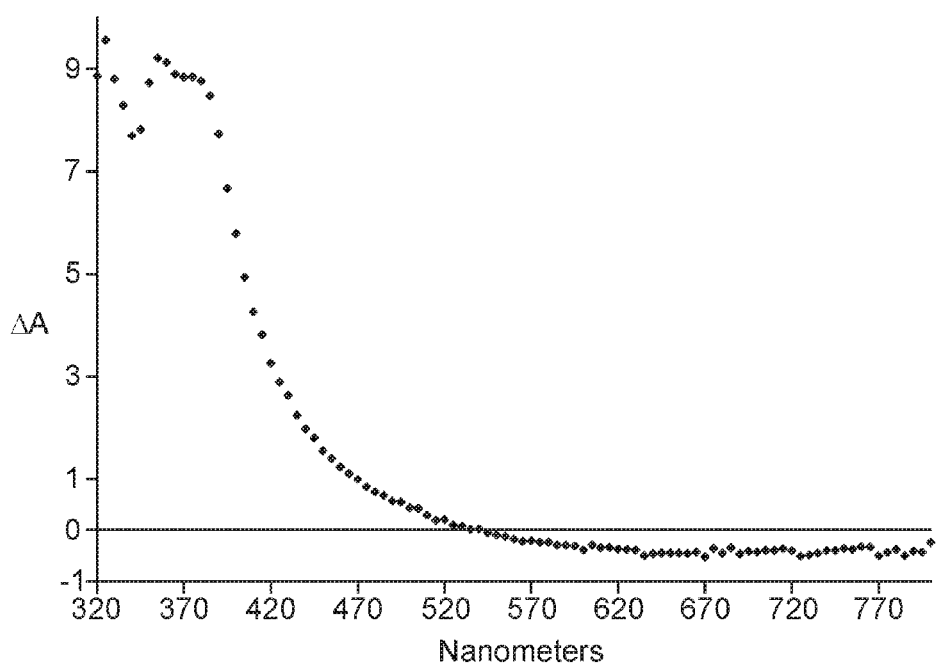
FIG. 13 is an absorption spectrum for an exemplary embodiment of a transparent electrode.

The depth over which the laser energy is absorbed, and thus the amount of nanostructured film material removed by a single laser pulse may depend on the materials' (i.e., the transparent conducting thin film and/or the substrate) physical (both optical and mechanical) properties and the laser wavelength. In some exemplary embodiments, the nanostructured film comprises silver nanowires, which generally exhibit absorption across the spectrum of wavelength in a range of 340 to 425 nanometers (and can therefore accommodate a potentially wide variety of lasers), as shown in FIG. 13.

While we do not wish to be bound by any particular theory, the mechanism by which conductivity is lost in the traces separating the conductive regions appears to involve laser-induced severing of nanowires and disruption of the nanowire network. The presence of metal within the laser traces can be demonstrated by use of time-of-flight secondary-ion mass spectrometry. In the case of silver nanowire transparent conducting coatings, although the metal nanowires are no longer present within the area of the laser trace, the silver metal can be seen to have been redeposited around the edges of the spots irradiated by the laser, forming a coating that is less discrete than the unirradiated nanowire coating but still non-conductive. Thus, in the patterned silver nanowire-based transparent conductor film, silver exists in the form of discrete nanowires in the conducting regions but may be present as a less discrete, more uniform but still nonconducting layer within the traces. The data also show no evidence for elevated silver levels within the crevices, suggesting that the silver nanowires can be essentially completely redistributed by the laser irradiation.

Embodiments

Item 1. A transparent electrical conductor, comprising:
a transparent substrate;
a composite layer comprising:
an electrically conductive layer disposed on at least a portion of a major surface of the transparent substrate and comprising a plurality of interconnecting metallic nanowires; and
a polymeric overcoat layer disposed on at least a portion of the electrically conductive layer;
wherein a pattern in the composite layer includes an x-axis and a y-axis of an x-y plane of the composite layer and a z-axis into the x-y plane of the composite layer, and the pattern defines a plurality of electrically conductive regions in the x-y plane of the composite layer, wherein the electrically conductive regions are separated from each other by electrically insulative traces, each of which defines a valley into the z-axis of the x-y plane of the composite layer, the valley having a maximum depth in a range from 10 nanometers to 100 nanometers relative to the x-y plane of the composite layer, wherein the valley has a cross-sectional width in a range from 10 micrometers to 1000 micrometers, and wherein the valley further comprises a plurality of crevices having a depth in a range from 50 nanometers to 100 nanometers further into the z-axis of the x-y plane of the composite layer.

Item 2. The transparent electrical conductor of item 1, wherein a depth of at least some of the crevices is at least 100 nanometers into the z-axis of the x-y plane of the composite layer, relative to the x-y plane of the composite layer.

Item 3. The transparent electrical conductor of any preceding item, wherein the valley has a lateral ridge along an edge of the valley, wherein the lateral ridge rises no more than 1% along the z-axis above the surface plane relative to the maximum depth of the valley.

Item 4. The transparent electrical conductor of any preceding item, wherein the polymeric overcoat layer comprises a reaction product of at least one multifunctional (meth)acrylate.

Item 5. The transparent electrical conductor of any preceding item, wherein the polymeric overcoat layer comprises metal oxide nanoparticles.

Item 6. The transparent electrical conductor of any preceding item, wherein the polymeric overcoat layer comprises an electroactive polymer.

Item 7. The transparent electrical conductor of any preceding item, wherein the plurality of interconnecting metal nanowires comprises silver.

Item 8. The transparent electrical conductor of any preceding item, wherein the transparent substrate is a layer having a thickness in a range from about 5 micrometers to about 1000 micrometers.

Item 9. The transparent electrical conductor of any preceding item, wherein the electrically conductive layer has a thickness in a range from about 50 nanometers to about 1 micrometer.

Item 10. The transparent electrical conductor of any preceding item, wherein the composite layer has a thickness in a range from about 50 nanometers to about 1 micrometer.

Item 11. The transparent electrical conductor of any preceding item, wherein the electrically insulative trace provides an electrical resistance of greater than 1 megaohm between the electrically conductive regions in the plurality of electrically conductive regions.

Item 12. An article comprising the transparent electrical conductor of any preceding item.

Item 13. A method for making the transparent electrode of any one of items 1 to 11, the method comprising:
providing a transparent electrically conductive film comprising:
a transparent substrate;
a composite layer comprising:
an electrically conductive layer disposed on at least a portion of a major surface of the transparent substrate and comprising a plurality of interconnecting metallic nanowires; and
a polymeric overcoat layer disposed on at least a portion of the electrically conductive layer; and
patternwise irradiating the transparent electrically conductive film according to a pattern to provide the transparent electrode.

Item 14. The method of item 13, wherein the pattern irradiating comprises irradiation with a laser.

Item 15. The method of item 14, wherein the laser is a pulsed UV laser.

Item 16. The method of item 14, wherein the laser is a continuous wave UV laser.

Item 17. The method of any one of items 13 to 16, wherein the patternwise irradiating comprises a roll-to-roll processing of the transparent electrically conductive film.

Item 18. The method of item 13, wherein the patternwise irradiating comprises severing at least some of the plurality of interconnecting metallic nanowires.

Item 19. The method of item 13, wherein the patternwise irradiating comprises disrupting of at least some of the plurality of interconnecting metallic nanowires within an irradiated area and redistributing metal from the metallic nanowires into a nonconducting, non-nanowire layer within the irradiated area.

EXAMPLES

Atomic Force Microscopy ("AFM"), in Tapping Mode

Transparent electrodes of the current description were analyzed with an atomic force microscopy ("AFM") instrument (obtained from Veeco Instruments, Inc., Santa Barbara, Calif., under the trade designation "VEECO DIMENSION 5000", including a "NANOSCOPE III" controller). The probes used were Olympus etched silicon probes ("OTESPA" probes, 1 Ωcm Silicon material), with a nominal force constant of 42 Newton/meter and a nominal resonance frequency of 300 kiloHertz. The data was analyzed using analysis software (from Bruker Nano, Inc., Santa Barbara, Calif., under the trade designation "NANOSCOPE ANALYSIS"). The images were flattened ($0^{th}$ order to remove z-offset between scan lines) and/or plane-fitted ($1^{st}$ order) to remove sample tilt. For AFM images (e.g., FIGS. 5A, 6A, 7A, 8A, 10A, and 12A), a lighter area represents a z-axis value above the mean x-y plane of the sample, while a darker area represents a z-axis value below the mean x-y plane of the sample. For AFM profiles (e.g., in FIGS. 5B, 5C, 6B, 7B, 8B, 10B, and 12B), the origin of the z-axis was assigned coincident with the mean height of all z-values of the (unirradiated land area) height images (i.e., topography images) within the profile analysis dataset. For the AFM images in FIGS. 5A, 6A, 7A, 8A, 10A, 12A, and 14A, the imaged area is 70 micrometers×70 micrometers in the x-y plane of the sample.

Materials

Materials used in the following examples are described in Table 1. All materials were used as received.

TABLE 1

| | |
|---|---|
| ATO SOL | Antimony tin oxide ("ATO") sol (obtained from Advanced Nano Products, Chungwon-kun, South Korea) as nominal 30 wt % ATO particles in isopropyl alcohol |
| ELVACITE 2041 | Methyl methacrylate polymer (obtained from Lucite International, Inc., Memphis, TN, under the trade designation "ELVACITE 2041") |
| FC-4430 | Fluorocarbon surfactant (obtained from 3M Co., St. Paul, MN, under the trade designation "FC-4430"), |
| IRGACURE 651 | Photoinitiator (obtained from Ciba Specialty Chemicals, Tarrytown, NY, under the trade designation "IRGACURE 651") |
| MELINEX 618 | Polyethylene terephthalate film, 5 mil (0.13 mm) gauge (obtained from DuPont Teijin Films, Wilmington, DE, under the trade designation "MELINEX 618") |
| METHOCEL E4M | Hydroxypropylmethylcellulose (obtained from Dow Chemical, Midland, MI, under the trade designation "METHOCEL E4M") as 2.5 percent by weight solution in deionized water |
| SLV-NW-60 | Silver nanowire (obtained from Blue Nano, Charlotte, NC, under the trade designation "SLV-NW-60") as 1.32 percent by weight dispersion in ethanol |
| SR444C | Pentaerythritol triacrylate (obtained from Sartomer Co., Exton, PA, under the trade designation "SR444C") |
| VP ADNANO LRC | UV curable coating solution with ITO nanoparticles (obtained from Evonik Degussa Corp., Parsippany, NJ, under the trade designation "VP ADNANO LRC") as 16% total solids |

Preparation of Overcoat Compositions OC-1 to OC-3

Overcoat compositions were prepared as described in pending U.S. Provisional Patent Application 61/475860 (Pellerite et al., filed on Apr. 15, 2011), which is incorporated herein by reference in its entirety.

Preparation of Overcoat Composition "OC-1"

A concentrate was prepared by dissolving an 85:15 weight-to-weight ("w/w") mixture of SR444C and ELVACITE 2041 in acetone to 10 wt % total solids. IRGACURE 651 was added at 0.2 wt % total solids. Coating solutions at 3 wt % solids were obtained by dilution into 1:1, by weight, isopropyl alcohol:diacetone alcohol.

Preparation of Overcoat Composition "OC-2"

VP ADNANO LRC was diluted to 5 wt % total solids in 1:1 isopropyl alcohol:diacetone alcohol immediately before use.

Preparation of Overcoat Composition "OC-3"

A concentrate was prepared by dissolving an 85:15 (w/w) mixture of SR444C and ELVACITE 2041 in acetone to 10 wt % total solids. IRGACURE 651 was added at 0.2 wt % total solids. Appropriate amounts of this concentrate and ATO SOL were mixed and diluted into 1:1 (w/w) isopropyl alcohol:diacetone alcohol to give an overcoat solution containing 3 wt % ATO and 2 wt % acrylic solids.

Preparation of Silver Nanowire Ink

A wide mouth screw top jar was charged with 58.85 grams of 0.05 wt % FC-4430 solution and 12.57 g of 2.5 wt % METHOCEL E4M solution, and the mixture was swirled until homogeneous to the unaided eye with 20:20 vision. SLV-NW-60 silver nanowire dispersion was then added in portions with swirling until a total of 26.78 grams dispersion had been added. The mixture was swirled by hand to ensure uniform dispersion of the silver nanowires, and then an additional 49.1 grams of the 0.05 wt % FC-4430 solution was added and the mixture was agitated by hand until homogeneous. The final dispersion was 0.24 wt % silver nanowires, 0.21 wt % hydroxypropyl-methylcellulose, and 0.037 wt % FC-4430.

Preparation of Transparent Electrodes TE1 to TE4

The silver nanowire ink prepared above was coated on 6 inch (15.2 cm) width, 5 mil (0.13 mm) gauge MELINEX 618 film using a 4 inch (10.2 cm) slot die coater operating at a web speed of 10 ft/min (3 m/min), ink flow rate of 4.0 cc/min, drying oven airflow 19.7 m/sec, and drying oven temperatures of 75° C. (zone 1) and 120° C. (zone 2). The above film was overcoated to make transparent electrode films using overcoat compositions "OC-1" (at 3 wt % solids) and "OC-2" (at 5 wt % solids). Coating was performed on the 4 inch (10.2 cm) die coater used for the ink coating, using the above oven and air flow settings, web speed of 20 ft/min (6.1 m/min), solution flow rates of 5 or 7 cc/min (as indicated in Table 2), UV plate temperature of 70° F. (21° C.), nitrogen atmosphere, and 100% UV lamp power. This procedure gave overcoats with nominal thicknesses in a range of 200 nm to 400 nm. Transmission and haze were measured using a haze meter (obtained from BYK-Gardner USA, Columbia Md., under the trade designation "HAZE-GARD PLUS"), and sheet resistance was measured using a contactless resistance probe (obtained from Delcom Instruments Inc., Prescott, Wis., under the trade designation "MODEL 717B"). Results are shown in Table 2.

TABLE 2

| Transparent Electrode | Overcoat | Overcoat Solution Flow Rate (cc/min) | Sheet Resistance (ohm/sq) | Transmission (%) | Haze (%) |
|---|---|---|---|---|---|
| TE1 | OC-1 | 5 | 100 | 86.9 | 4.8 |
| TE2 | OC-1 | 7 | 204 | 88.8 | 4.0 |
| TE3 | OC-2 | 5 | 217 | 86.9 | 8.6 |
| TE4 | OC-2 | 7 | 204 | 86.6 | 7.1 |

Example 1

Laser Patternwise Irradiating of Transparent Electrodes TE1 to TE4

The above transparent electrodes were patterned using a laser system (obtained from ESI, Portland, Oreg., under the trade designation "5100 LASER SYSTEM") equipped with a Nd:YVO4 laser operating at 355 nm with a 20 ns pulse width. Other parameters were as follows: bite size was 15 micrometers, velocity was 300 mm/sec, repetition rate was 20 kHz, and laser power was one of 60, 100, 150, or 215 milliWatts ("mW") as listed in Tables 3, 4, and 5 below.

A one-inch (2.54 cm) square pattern was drawn (i.e., etched) by the laser on each transparent electrode, using the above conditions. Electrical isolation was assessed by measurement of electrical resistance between the inside and outside of the square using a two-point probe, and was measured in megaohms. Results of the resistance measurements to determine electrical isolation are shown in Table 3.

TABLE 3

| Transparent Electrode | Electrical isolation after laser irradiation at the indicated power level in milliWatts (mW) | | | |
|---|---|---|---|---|
| | 60 mW | 100 mW | 150 mW | 215 mW |
| TE1 | Yes | Yes | Yes | Yes |
| TE2 | No | No | Yes | Yes |
| TE3 | No | No | Yes | Yes |
| TE4 | No | No | Yes | Yes |

In Table 3, a designation of "Yes" meant that the resistance measured across the laser trace between the inside and outside of the laser-etched one-inch (2.54 cm) square was greater than 1 megaohm, while an indication of "No" meant that the resistance measured across the laser trace between the inside and outside of the laser-etched square was not greater than 1 megaohm.

Transparent electrodes TE1 and TE4 were selected for further analysis by visible microscopy and atomic force microscopy. Darkfield visible micrographs of traces prepared at all four laser power levels are shown in FIGS. 3A to 3D (for TE1), and in FIGS. 4A to 4D (for TE4) (see Table 4 for association of figure number with Transparent Electrode and laser irradiation power level).

TABLE 4

| Transparent Electrode | Laser irradiation power level in milliWatts | FIG. No. |
|---|---|---|
| TE1 | 60 | 3A |
| TE1 | 100 | 3B |
| TE1 | 150 | 3C |
| TE1 | 215 | 3D |
| TE4 | 60 | 4A |
| TE4 | 100 | 4B |
| TE4 | 150 | 4C |
| TE4 | 215 | 4D |

FIGS. 3A to 3D and 4A to 4D illustrated the effect of varying the laser power on trace structure. At sufficiently high power levels, damage to the substrate became evident at powers beyond what was needed to prepare electrically isolating traces. Such damage was seen as bright spots 37 and 47 in the middle of the laser irradiation. Bright spots 37 and 47 (and 37' and 47') became larger as laser power increased. These bright spots can correspond to profile features that are raised above the x-y plane of unirradiated land areas 33 and 34 (and 43 and 44).

AFM images and AFM profiles of select laser traces were generated according to the "AFM in Tapping Mode" method. The corresponding transparent electrode samples, irradiation power, and figure numbers are indicated in Table 5.

TABLE 5

| Transparent Electrode | Laser irradiation power level in milliWatts | AFM image, FIG. No. | AFM profile(s), FIG. No. |
|---|---|---|---|
| TE1 | 60 | 5A | 5B & 5C |
| TE4 | 150 | 6A | 6B |
| TE1 | 100 | 7A | 7B |
| TE4 | 215 | 8A | 8B |

Figure 5A:
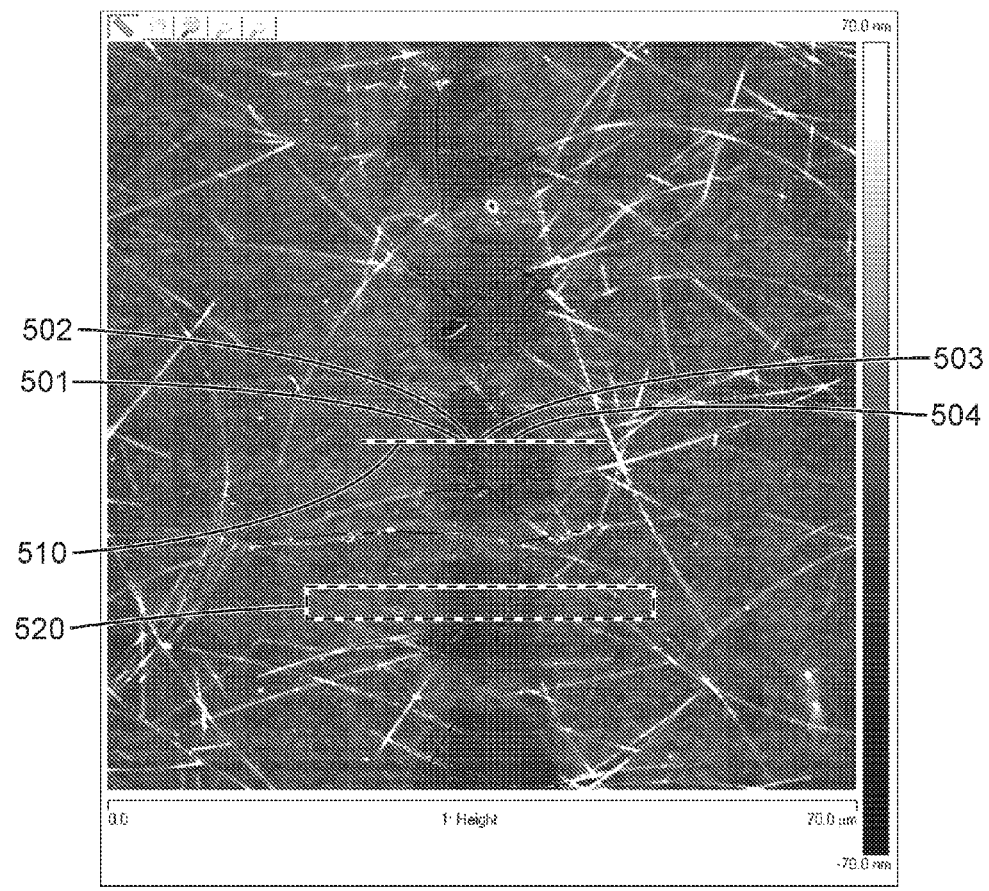
FIG. 5A is an atomic force microscopy image of a laser trace in exemplary embodiment of a transparent electrode.
Figure 5B:
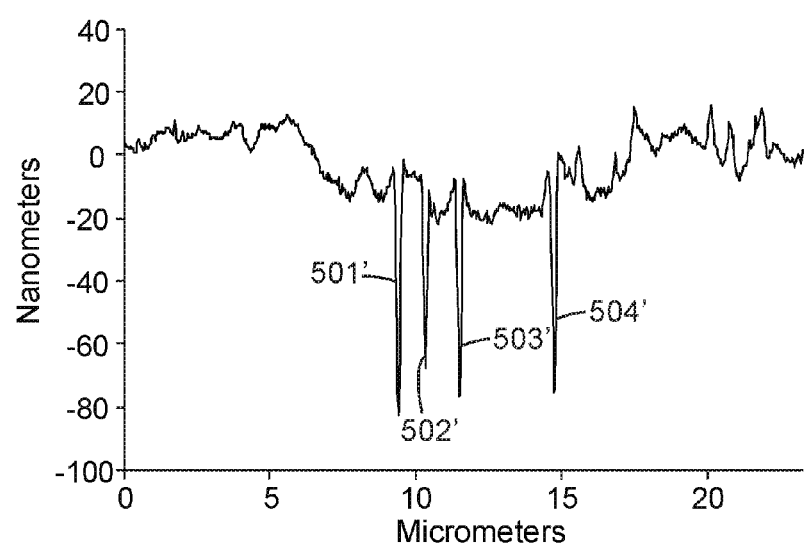
FIGS. 5B and 5C are profile analyses of the laser trace of FIG. 5A.
Figure 5C:
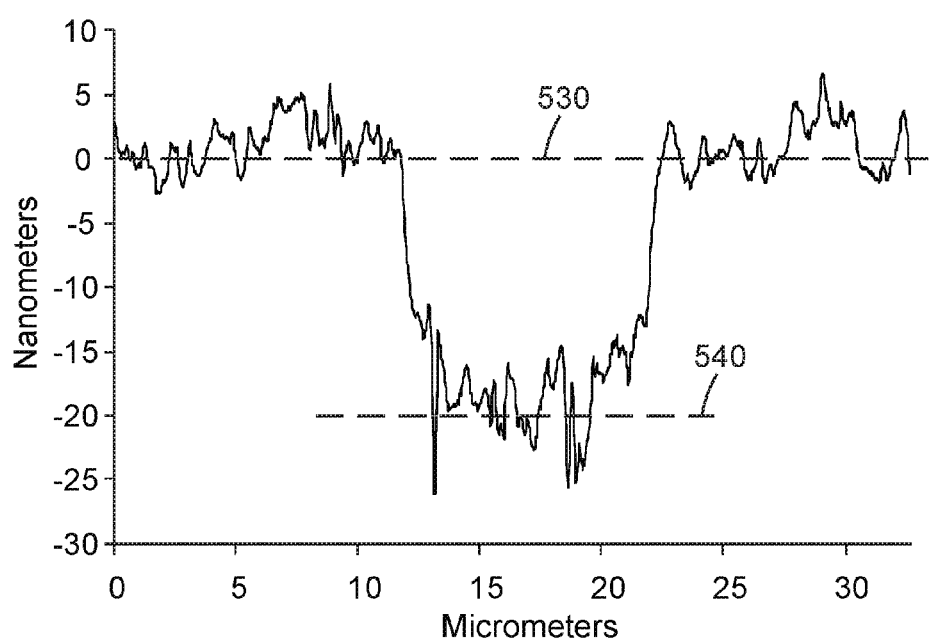

FIG. 5A is an atomic force microscopy image (height or topography) of a laser trace in exemplary embodiment of a transparent electrode. The imaged area is 70 micrometers× 70 micrometers in the x-y plane, and the range from the darkest to the lightest tone represents 140 nm of height in the z-direction. FIGS. 5B and 5C are profile analyses of the laser trace of FIG. 5A. In FIG. 5A, line 510 represents the portion of the image analyzed to generate the AFM profile in FIG. 5B. Dark lines 501, 502, 503, and 504 in FIG. 5A corresponded with crevices 501', 502', 503', and 504' in FIG. 5B, respectively. The "valley" of the laser trace in FIG. 5B was observed to be about 20 nm deep and about 12 micrometers wide, with the crevices extending to about 80 nanometers along the z-axis (i.e., about 60 nm further along the z-axis than the maximum depth of the valley).

Figure 6A:
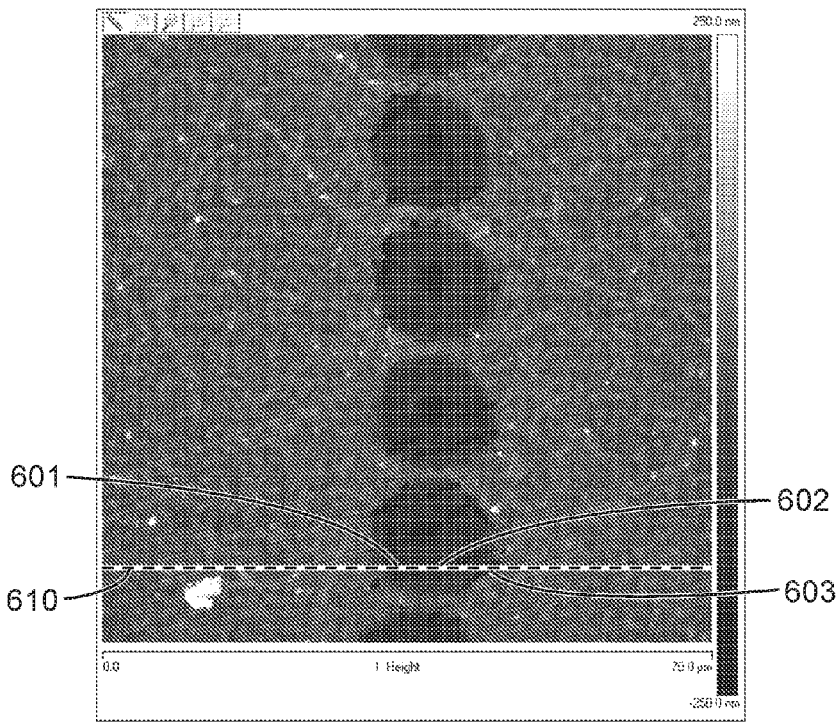
FIG. 6A is an atomic force microscopy image of a laser trace in an exemplary embodiment of a transparent electrode.
Figure 6B:
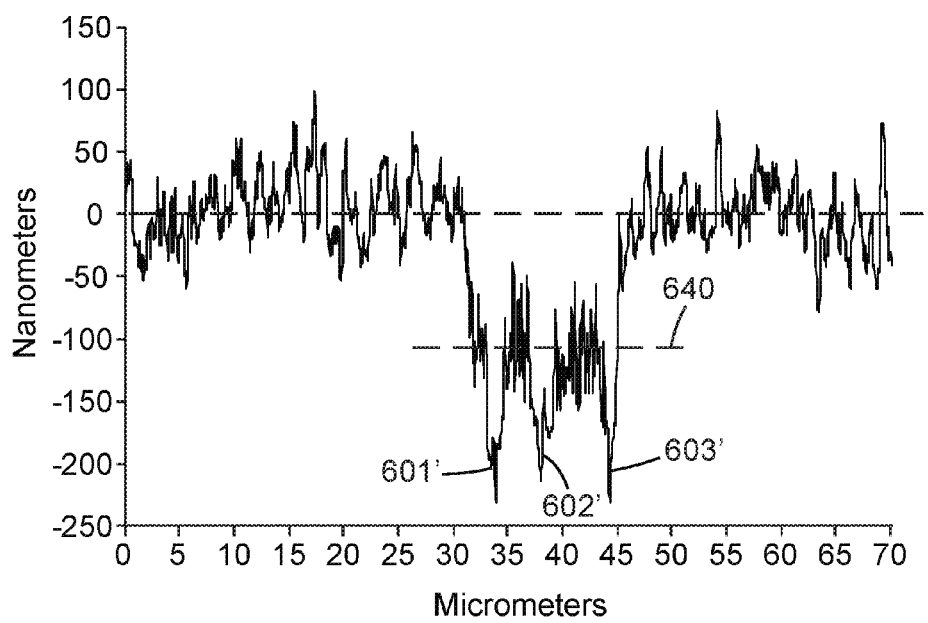
FIG. 6B is a profile analysis of the laser trace of FIG. 6A.

Again referring to FIG. 5A, area 520 represents the portion of the image analyzed to generate the AFM profile in FIG. 5C. In this analysis, the aspect of maximum valley depth was emphasized while the relatively fine crevices along the path of the laser trace were less evident, due to averaging of z-values along the path of the laser. In FIG. 5C, the maximum valley depth 540 was again seen to be about 20 nm along the z-axis from the x-y plane 530, and the valley width was roughly 12 micrometers wide. Similar effects are seen in FIG. 6A and FIG. 6B, with a valley showing maximum depth 640 of about 100 nm and crevices 601'-603' with depths up to 100 nm beyond the valley's maximum depth 640 (crevices 601-603' correspond with dark lines 601-603 at points where they cross line 610 in FIG. 6A.

Figure 7A:
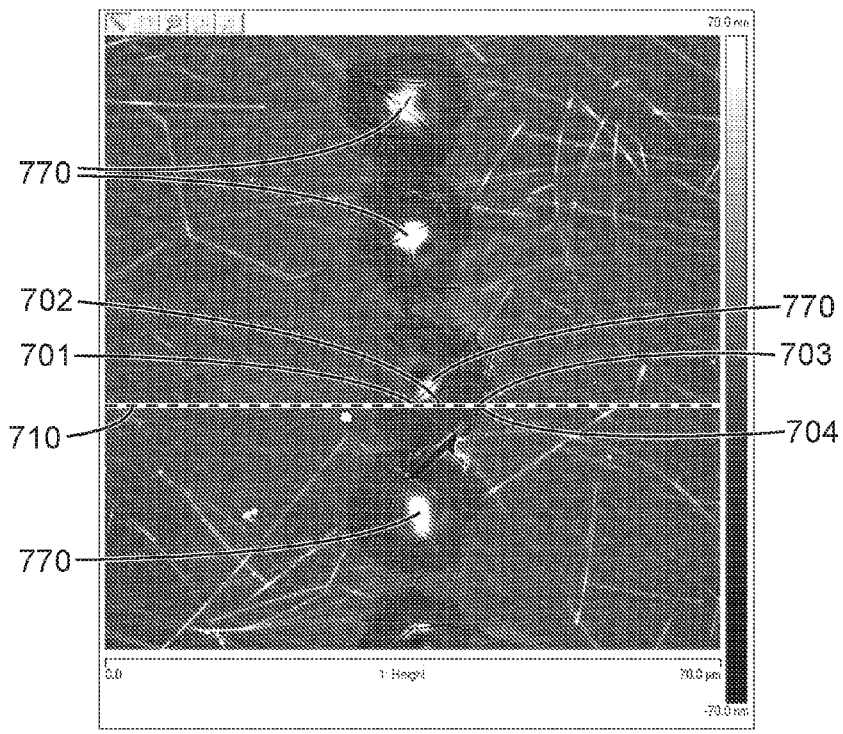
FIG. 7A is an atomic force microscopy image of a laser trace in an exemplary embodiment of a transparent electrode.
Figure 7B:
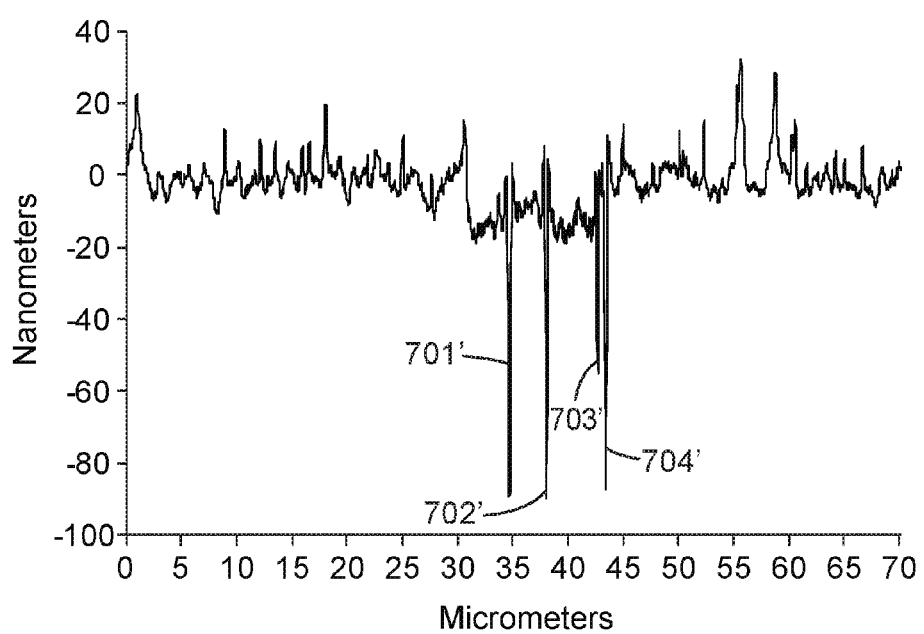
FIG. 7B is a profile analysis of the laser trace of FIG. 7A.
Figure 8A:
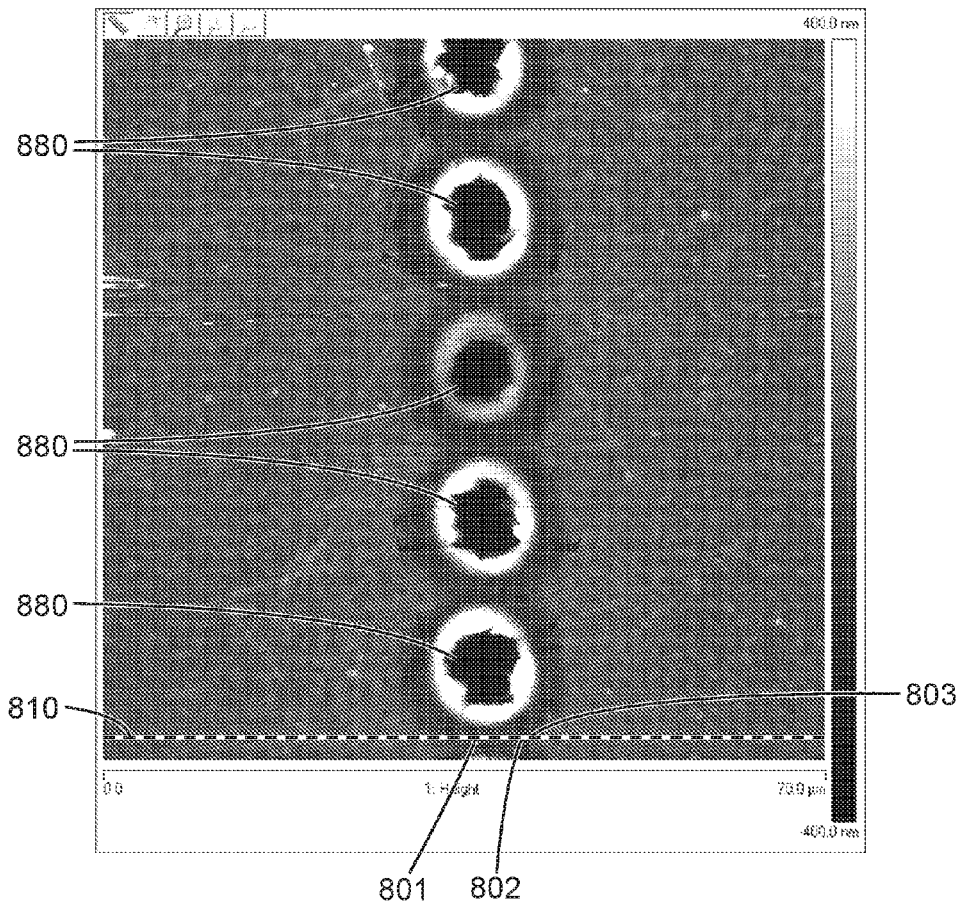
FIG. 8A is an atomic force microscopy image of a laser trace in an exemplary embodiment of a transparent electrode.
Figure 8B:
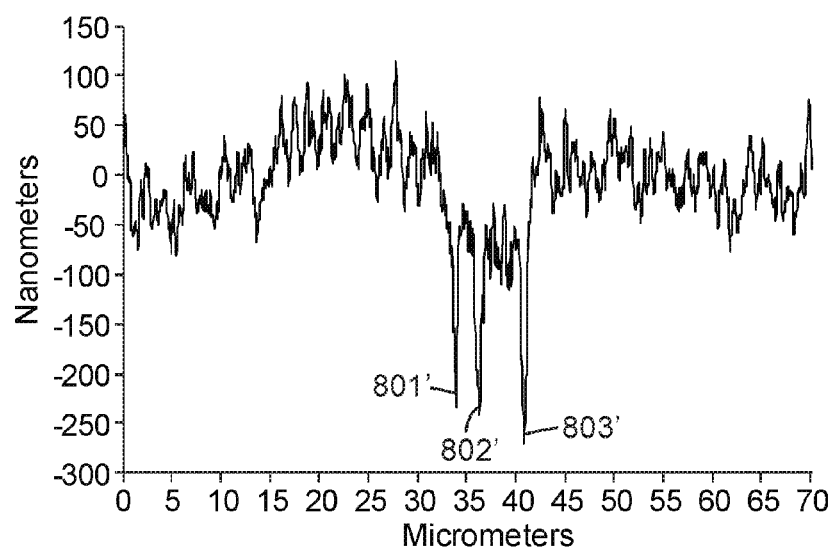
FIG. 8B is a profile analysis of the laser trace of FIG. 8A.

FIG. 7A and 8A illustrate damage to the transparent electrodes TE1 and TE4, respectively, due to laser irradiation at increased power levels, as observed at laser-damaged spots 770 and 880. However, away from the laser-damaged spots, dark lines 701, 702, 703 and 704 were observed, corresponding with crevices 701', 702', 703' and 704' at points where the dark lines crossed line 710; and dark lines 801, 802, and 803 corresponded with crevices 801', 802' and 803', at points where the dark lines crossed line 810. A valley with a width of about 12 microns and a maximum depth of about 80 nm is also seen in FIG. 8B.

Preparation of Transparent Electrodes TE5 and TE6

A silver nanowire transparent conductor coating (TCC) was prepared on the primed side of MELINEX 618 film using a silver nanowire dispersion and a 3.1 wt % solids solution of a UV-curable acrylic protective overcoat prepared according to methods disclosed in WO 2008/46058 (Allemand et al.). The silver dispersion was applied using a 10 inch (25.4 cm) die coater operating at a web speed of 15 ft/min (4.6 m/min), ink flow rate of 23 cc/min, and drying oven temperatures of 40° C. (zone 1), 80° C. (zone 2), and 120° C. (zone 3). The overcoat was applied on the 10 inch (25.4 cm) die coater used for the silver ink coating, using the above oven and air flow settings, web speed of 30 ft/min (9.1 m), solution flow rate of 20 cc/min, UV backup roll temperature 70° F. (21° C.), nitrogen atmosphere, and 100% UV lamp (H bulb) power. This film, designated TE5, exhibited sheet resistance of 103 ohm/sq, visible light transmission 89.5%, and haze 2.6% measured using the methods described in the preparation of transparent electrodes TE1 to TE4.

A second lot of film was prepared using identical materials and procedures except the silver ink flow rate was 25 cc/min, the above overcoat was replaced with solution OC-3 prepared as described above, and the overcoat solution flow rate was 18 cc/min. This film, designated TE6, showed sheet resistance 60 ohm/sq, 86% transmission, and 2.3% haze using the methods described in the preparation of exemplary transparent electrodes TE1 to TE4.

Example 2

Laser Patternwise Irradiating of Transparent Electrodes TE5 and TE6

Laser irradiation was performed using a frequency-tripled Nd:YVO4 laser (obtained from Coherent Avia, Santa Clara, Calif.) operating at 355 nm, with a GSI 3-D analog scanner (MODEL NUMBER E10-202861). Laser parameters were as follows: Pulse repetition rate 40 kHz, pulse time duration approximately 50 nsec, laser peak output power 0.44 W, single pulse energy 22 µJ, pulse peak power 440 W, focused spot size approximately 68µ in diameter, scan speed 500 mm/sec. Peak power was attenuated to 55-70% for these experiments. Using these laser conditions, a trace in the shape of a square pattern about 1 inch (2.5 cm) on a side was etched into the transparent conducting films described above. Electrical isolation of the interior and exterior of the squares was assessed using a 2-point probe and voltmeter, and the traces were analyzed by visible light microscopy and atomic force microscopy.

Film samples of transparent electrodes TE5 and TE6 were subjected to the above UV laser processing conditions, and laser-etched square patterns at 55-70 percent laser power were obtained. Two-point probe measurements of the electrical resistance between points inside and outside of the squares were used to assess extent of electrical isolation, and the results are shown in Table 6.

TABLE 6

| Transparent Electrode | Isolation at percent Laser Power | | | |
|---|---|---|---|---|
| | 55 | 60 | 63 (TE5); 65 (TE6) | 70 |
| TE5 | Yes | Yes | Yes | Yes |
| TE6 | No | No | Yes | Yes |

Observation of open-circuit resistance (>1 megaohm) was taken as evidence for electrical isolation.

Figure 9A:
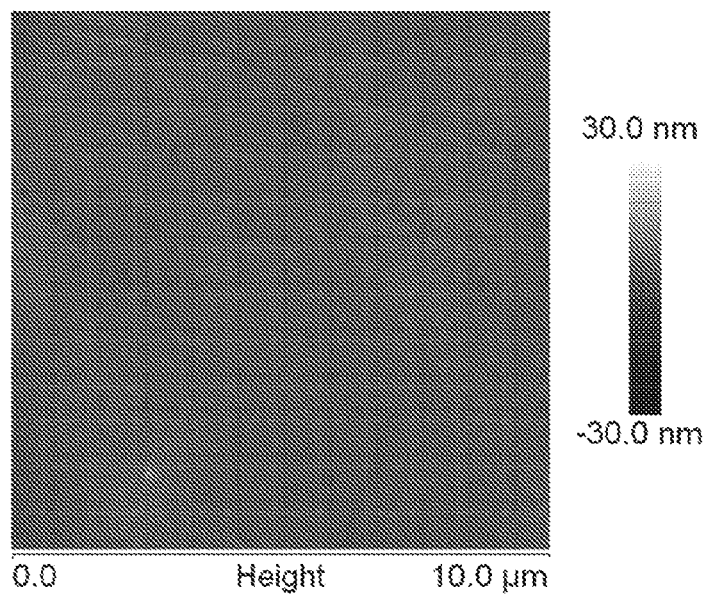
FIGS. 9A and 9B are atomic force microscopy images of unirradiated film samples.
Figure 9B:
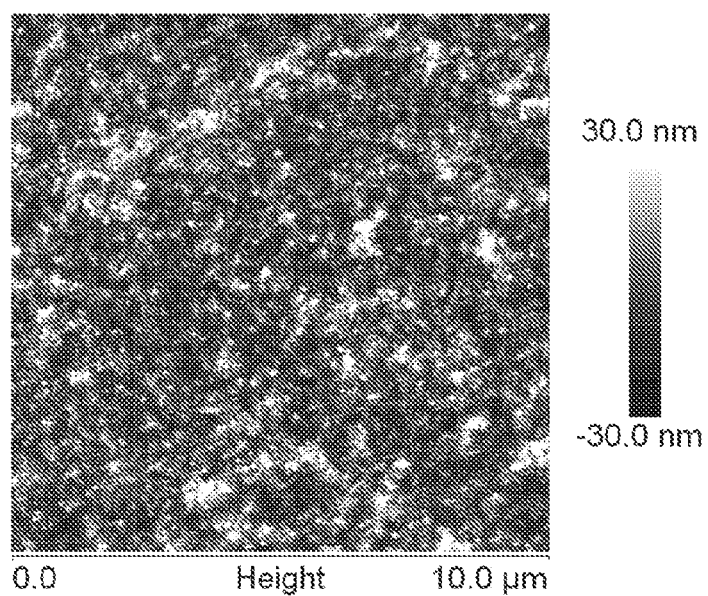

FIGS. 9A and 9B show AFM images of non-irradiated (i.e., control) areas of TE5 and TE6, respectively. The imaged area is 10 micrometers×10 micrometers in each of these images.

Figure 10A:
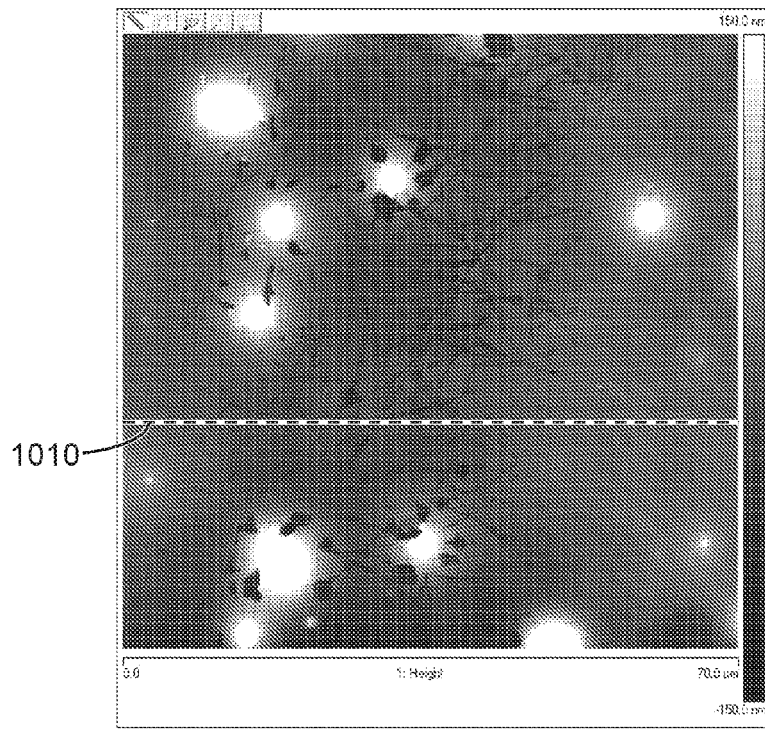
FIG. 10A is an atomic force microscopy image of a laser trace in an exemplary embodiment of a transparent electrode.
Figure 10B:
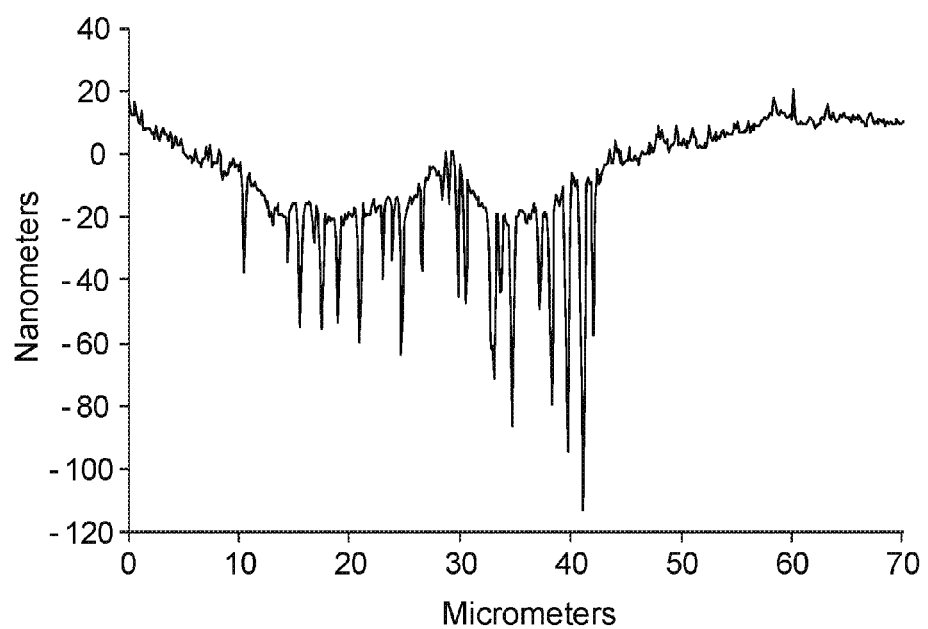
FIG. 10B is a profile analysis of the laser trace of FIG. 10A.
Figure 11:
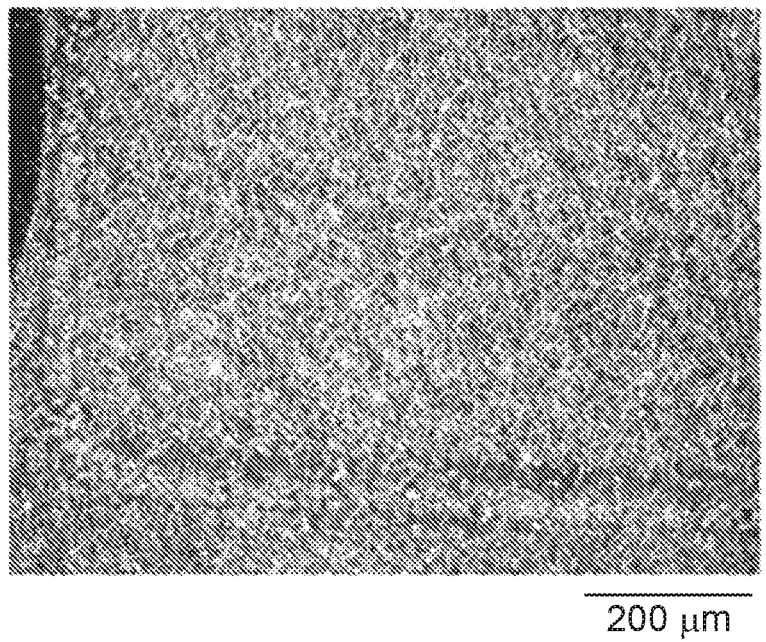
FIG. 11 is a darkfield visible micrograph of a laser trace in an exemplary embodiment of a transparent electrode.

FIG. 10A is an atomic force microscopy image (height or topography) of a laser trace in exemplary embodiment of a transparent electrode. The imaged area is 70 micrometers× 70 micrometers in the x-y plane, and the range from the darkest to the lightest tone represents 300 nm of height in the z-direction. FIG. 10B is a profile analysis of the laser trace of FIG. 10A. FIGS. 10A and 10B are an AFM image and profile analysis of the laser trace in TE5 at 63% laser power. Line 1010 in FIG. 10A represents the portion of the image analyzed to generate the AFM profile in FIG. 10B. Bright spots in FIG. 10A are believed to be due to gel particulates in the overcoat layer, and not related to laser processing. FIG. 11 is a visible micrograph of the trace in FIG. 10A, showing the nanowire geometry and the discrete structure of the conducting mesh in the unirradiated area.

Figure 12A:
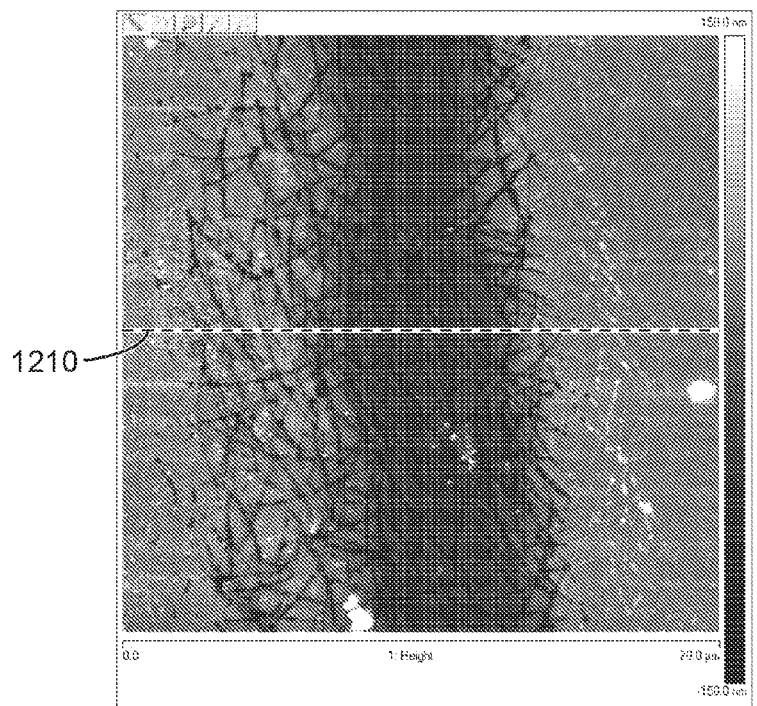
FIG. 12A is an atomic force microscopy image of a laser trace in an exemplary embodiment of a transparent electrode.
Figure 12B:
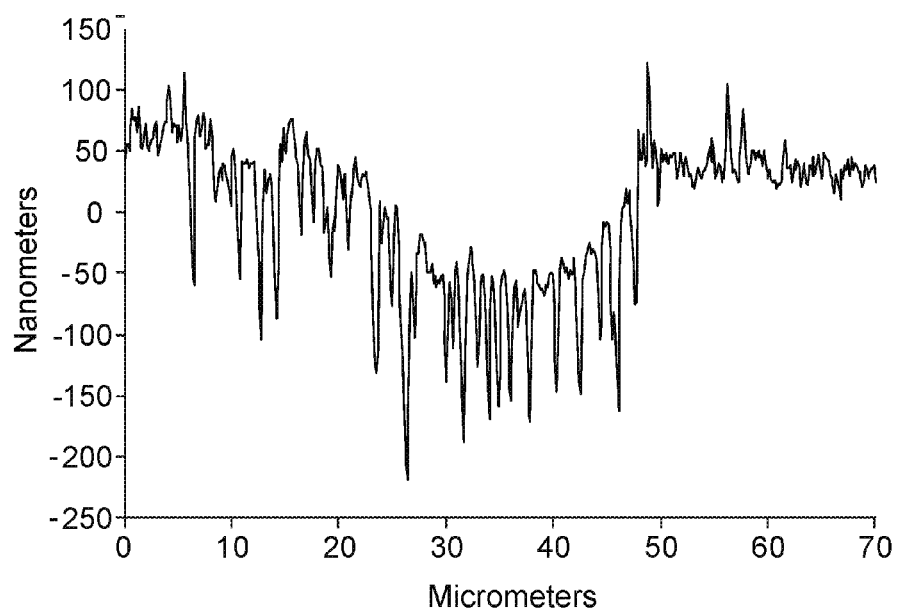
FIG. 12B is a profile analysis of the laser trace of FIG. 12A.

FIG. 12A is an atomic force microscopy image (height or topography) of a laser trace in TE6 at 65% laser power. The imaged area is 70 micrometers×70 micrometers in the x-y plane, and the range from the darkest to the lightest tone represents 300 nm of height in the z-direction. FIG. 12B is a profile analysis of the laser trace of FIG. 12A. Line 1210 in FIG. 12A represents the portion of the image analyzed to generate the AFM profile in FIG. 12B.

Determination of Absorption Spectrum for Transparent Electrode TE5

The absorption spectrum was determined for the silver nanowire transparent conducting coating on sample TE5, using a Lambda 900 UV/Visible spectrophotometer (available from Perkin-Elmer, Waltham Mass.) and the following procedure:
1) Measure transmission (% T) and reflection (% R) for uncoated PET film
2) Measure % T and % R for sample TE5
3) Calculate A=100−% T−% R for both uncoated PET ("$A_{PET}$") and sample TE5 ("$A_{TE5}$")
4) Calculate and plot $\Delta A = A_{PET} - A_{TE5}$ The resulting plot of ΔA is shown in FIG. 13. The data showed a strong absorption in the vicinity of 370 nm, extending out past 400 nm. This suggests that lasers producing output with wavelengths up to 450 nm could be used to pattern this transparent conducting film.

Comparative Example 1

A sample of ITO on 5 mil (0.13 mm) PET film (obtained from Techni-Met, Windsor, Conn.; Delcom sheet resistance 125 ohm/sq) was subjected to the same UV laser processing conditions used for TE5 and TE6, to generate a set of samples treated with the square pattern at 55, 60, 65, and 70% laser power. An additional sample was treated at 1 msec scan speed and 50% laser power to minimize substrate damage. All samples except the latter showed electrical isolation between the interior and exterior of the square. Samples were subjected to imaging and laser trace profile analysis by AFM.

Figure 14A:
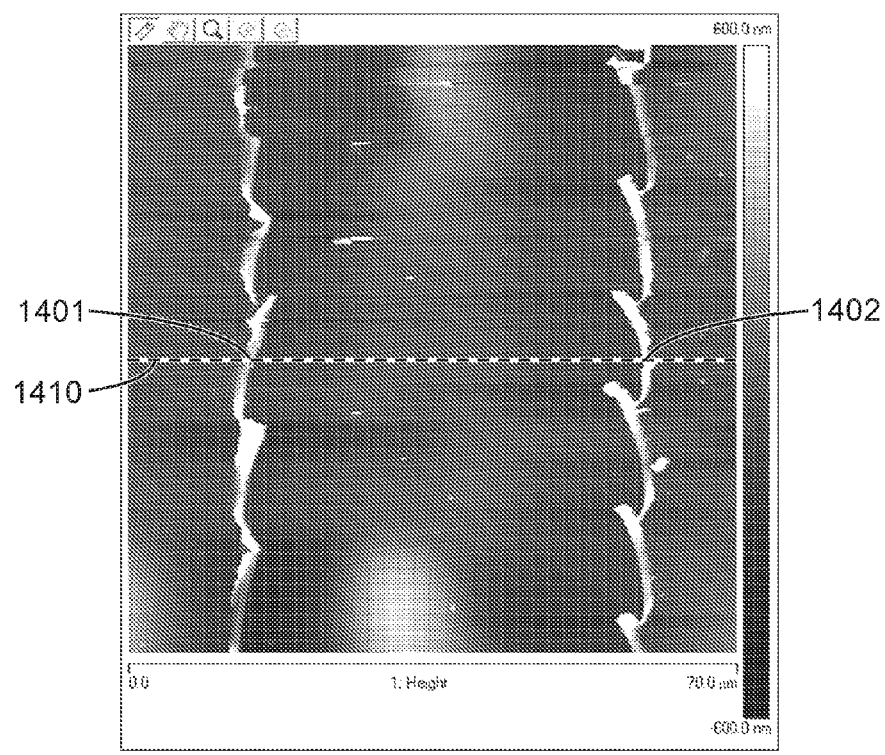
FIGS. 14A and 14B are atomic force microscopy image and profile analysis, respectively, of a laser trace on an ITO PET film.
Figure 14B:
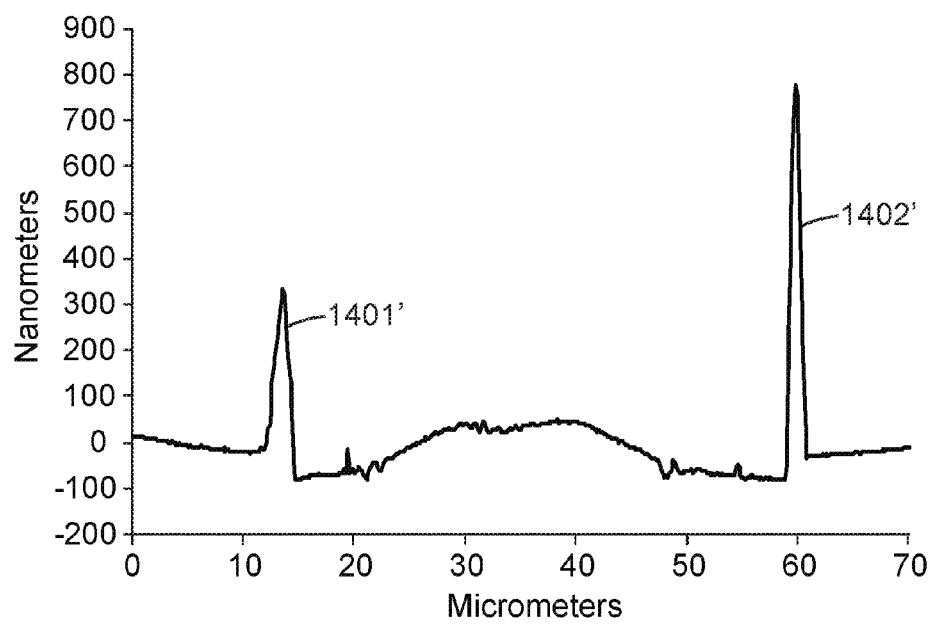

Results for the sample irradiated at 65% laser power are shown in FIGS. 14A (AFM image) and 14B (AFM profile analysis). The imaged area is 70 micrometers×70 micrometers in the x-y plane, and the range from the darkest to the lightest tone represents 1200 nm of height in the z-direction. Line 1410 in FIG. 14A represents the portion of the image analyzed to generated the AFM profile in FIG. 14B. The AFM profile analysis in FIG. 14B showed accumulation of ablated material on the edges 1401' and 140' of the trace (corresponding to 1401 and 1402 in FIG. 14A, respectively), to a height of up to 1.5 micrometers.

Comparative Example 2

Figure 15:
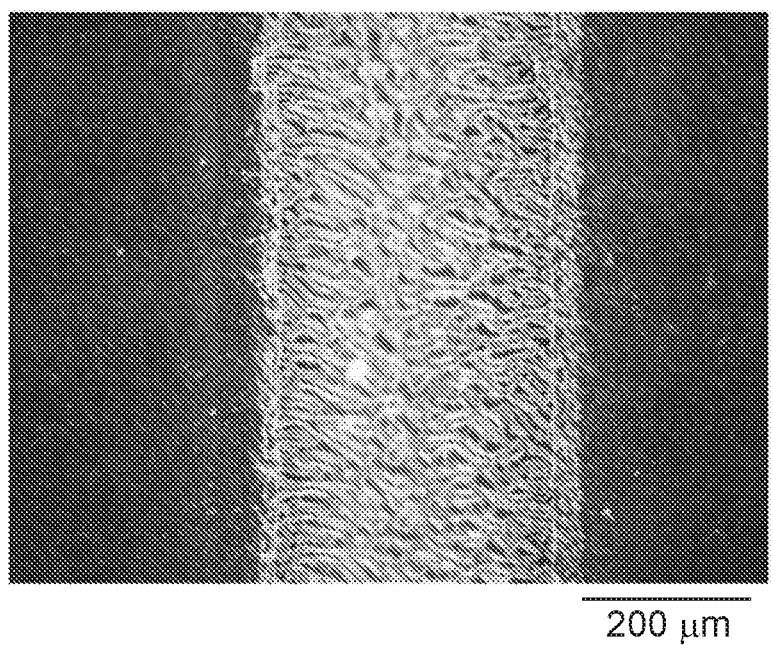
FIG. 15 is a visible micrograph at 200× of a laser trace in a transparent conducting film sample.

In this experiment, a pulsed $CO_2$ laser was used in an attempt to pattern the silver nanowire transparent conducting coating on transparent electrode sample TE5. Irradiation was performed using a pulsed $CO_2$ laser (obtained from Coherent Avia, Santa Clara, Calif., under the trade designation "E400") operating at a pulse repetition rate of 166 kHz. A scanner (obtained from ScanLab, St. Charles, Ill., under the trade designation "POWERSCAN 30") was used which focused the laser to a spot size around 150 microns. At this pulse rate, the minimum steady-state laser output power was approximately 350 Watts, so due to the high output power the laser was defocused to a spot size of 1 to 2 mm. In the experiment, the scanner was running up to its maximum speed of 7.6 m/s. As shown in the visible micrograph in FIG. 15, the laser trace (which was highly visible to the unaided eye) showed extensive melting of the PET substrate. While this trace gave electrical isolation of the square pattern, defocusing the laser further in order to cause less substrate damage still gave bubbling of the film, highly visible traces, and no electrical isolation.

What is claimed is:

1. A transparent electrical conductor, comprising:
a transparent substrate;
a composite layer comprising:
an electrically conductive layer disposed on at least a portion of a major surface of the transparent substrate and comprising a plurality of interconnecting metallic nanowires; and
a polymeric overcoat layer disposed on at least a portion of the electrically conductive layer;
wherein a pattern in the composite layer includes an x-axis and a y-axis of an x-y plane of the composite layer and a z-axis into the x-y plane of the composite layer, and the pattern defines a plurality of electrically conductive regions in the x-y plane of the composite layer, wherein the electrically conductive regions are separated from each other by electrically insulative traces, each of which defines a valley into the z-axis of the x-y plane of the composite layer, the valley having a maximum depth in a range from 10 nanometers to 100 nanometers relative to the x-y plane of the composite layer, wherein the valley has a cross-sectional width in a range from 10 micrometers to 1000 micrometers, and wherein the valley further comprises a plurality of crevices having a depth in a range from 50 nanometers to 100 nanometers further into the z-axis of the x-y plane of the composite layer.

2. The transparent electrical conductor of claim 1, wherein a depth of at least some of the crevices is at least 100 nanometers into the z-axis of the x-y plane of the composite layer, relative to the x-y plane of the composite layer.

3. The transparent electrical conductor of claim 1, wherein the valley has a lateral ridge along an edge of the valley, wherein the lateral ridge rises no more than 1% along the z-axis above the surface plane relative to the maximum depth of the valley.

4. The transparent electrical conductor of claim 1, wherein the polymeric overcoat layer comprises a reaction product of at least one multifunctional (meth)acrylate.

5. The transparent electrical conductor of claim 1, wherein the polymeric overcoat layer comprises metal oxide nanoparticles.

6. The transparent electrical conductor of claim 1, wherein the polymeric overcoat layer comprises an electro-active polymer.

7. The transparent electrical conductor of claim 1, wherein the plurality of interconnecting metal nanowires comprises silver.

8. The transparent electrical conductor of claim 1, wherein the transparent substrate is a layer having a thickness in a range from about 5 micrometers to about 1000 micrometers.

9. The transparent electrical conductor of claim 1, wherein the electrically conductive layer has a thickness in a range from about 50 nanometers to about 1 micrometer.

10. The transparent electrical conductor of claim 1, wherein the composite layer has a thickness in a range from about 50 nanometers to about 1 micrometer.

11. The transparent electrical conductor of claim 1, wherein the electrically insulative trace provides an electrical resistance of greater than 1 megaohm between the electrically conductive regions in the plurality of electrically conductive regions.

12. An article comprising the transparent electrical conductor of claim 1.

13. A method for making the transparent electrode of claim 1, the method comprising:
providing a transparent electrically conductive film comprising:
a transparent substrate;
a composite layer comprising:
an electrically conductive layer disposed on at least a portion of a major surface of the transparent substrate and comprising a plurality of interconnecting metallic nanowires; and
a polymeric overcoat layer disposed on at least a portion of the electrically conductive layer; and
patternwise irradiating the transparent electrically conductive film according to a pattern to provide the transparent electrode.

14. The method of claim 13, wherein the patternwise irradiating comprises irradiation with a laser.

15. The method of claim 14, wherein the laser is a pulsed UV laser.

16. The method of claim 14, wherein the laser is a continuous wave UV laser.

17. The method of claim 13, wherein the patternwise irradiating comprises a roll-to-roll processing of the transparent electrically conductive film.

18. The method of claim 13, wherein the patternwise irradiating comprises severing at least some of the plurality of interconnecting metallic nanowires.

19. The method of claim 13, wherein the patternwise irradiating comprises disrupting of at least some of the plurality of interconnecting metallic nanowires within an irradiated area and redistributing metal from the metallic nanowires into a nonconducting, non-nanowire layer within the irradiated area.

* * * * *

UNITED STATES PATENT AND TRADEMARK OFFICE
CERTIFICATE OF CORRECTION

PATENT NO. : 9,603,242 B2
APPLICATION NO. : 14/360413
DATED : March 21, 2017
INVENTOR(S) : Mark Pellerite Page 1 of 1

It is certified that error appears in the above-identified patent and that said Letters Patent is hereby corrected as shown below:

Column 18
Line 10, delete "504'in" and insert -- 504' in --, therefor.

Column 20
Line 16 (approx.), delete "("$A_{TES}$")" and insert -- ("$A_{TE5}$") --, therefor.
Line 31, delete "msec" and insert -- m/sec --, therefor.
Line 45, delete "140'" and insert -- 1402' --, therefor.

Signed and Sealed this
Twenty-sixth Day of December, 2017

Joseph Matal
*Performing the Functions and Duties of the
Under Secretary of Commerce for Intellectual Property and
Director of the United States Patent and Trademark Office*